US012604543B2

(12) United States Patent
Kim

(10) Patent No.: US 12,604,543 B2
(45) Date of Patent: Apr. 14, 2026

(54) MANUFACTURING METHOD OF IMAGE SENSOR PACKAGE

(71) Applicant: Samsung Electronics Co., Ltd., Suwon-si (KR)

(72) Inventor: Sunjae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 341 days.

(21) Appl. No.: 18/141,295

(22) Filed: Apr. 28, 2023

(65) Prior Publication Data

US 2023/0420469 A1 Dec. 28, 2023

(30) Foreign Application Priority Data

Jun. 24, 2022 (KR) ........................ 10-2022-0077812

(51) Int. Cl.
*H10F 39/00* (2025.01)
*H10F 39/18* (2025.01)

(52) U.S. Cl.
CPC ......... *H10F 39/018* (2025.01); *H10F 39/182* (2025.01); *H10F 39/8053* (2025.01); *H10F 39/8063* (2025.01); *H10F 39/809* (2025.01); *H10F 39/811* (2025.01); *H01L 2223/5446* (2013.01)

(58) Field of Classification Search
CPC .... H10F 39/018; H10F 39/809; H10F 39/182; H10F 39/811; H10F 39/8063; H10F 39/024; H10F 39/8053; H10F 39/028; H01L 2223/5446
See application file for complete search history.

(56) References Cited

U.S. PATENT DOCUMENTS 9,136,241 B2 9/2015 Yen et al.
9,419,033 B2 8/2016 Hsu et al.
(Continued)

FOREIGN PATENT DOCUMENTS

KR 1020180040657 A 4/2018
KR 1020210012302 A 2/2021
KR 10-2021-0115480 A 9/2021

OTHER PUBLICATIONS

A Short Guide to Laser Welding Plastics; (https://plasticsdecorating.com/articles/2020/a-short-guide-to-laser-welding-plastics/) (Nov. 2, 2020).

*Primary Examiner* — Changhyun Yi
(74) *Attorney, Agent, or Firm* — Muir Patent Law, PLLC

(57) ABSTRACT

Provided is a method of manufacturing an image sensor package, the method including preparing a device wafer including a plurality of chip portions and a scribe lane, forming a redistribution insulating film on a lower surface of the device wafer to cover a redistribution pattern and a portion of the redistribution pattern and to cover a lower surface of the device wafer, forming a redistribution pattern on a lower surface of the device wafer and a redistribution insulating film to cover a portion of the redistribution pattern and to cover a lower surface of the device wafer, placing a preliminary transparent substrate on an upper surface of the device wafer on which the preliminary dam pattern is formed, performing a laser bonding process of radiating a laser beam to the preliminary dam pattern, and performing a singulation process forming individual image sensor packages.

18 Claims, 18 Drawing Sheets

1006

(56)            References Cited

U.S. PATENT DOCUMENTS

| | | | |
|---|---|---|---|
| 9,601,531 B2 | 3/2017 | Wang et al. | |
| 2006/0082737 A1* | 4/2006 | Sterner | G03B 21/008 |
| | | | 353/102 |
| 2018/0090524 A1 | 3/2018 | Wang | |
| 2018/0182806 A1* | 6/2018 | Jin | H10F 39/805 |
| 2018/0308890 A1 | 10/2018 | Wang et al. | |
| 2018/0337206 A1* | 11/2018 | Wang | H10F 39/811 |
| 2021/0028217 A1 | 1/2021 | Cho et al. | |

* cited by examiner

MANUFACTURING METHOD OF IMAGE SENSOR PACKAGE

CROSS-REFERENCE TO RELATED APPLICATION

This application is based on and claims priority under 35 U.S.C. § 119 to Korean Patent Application No. 10-2022-0077812, filed on Jun. 24, 2022, in the Korean Intellectual Property Office, the disclosure of which is incorporated by reference herein in its entirety.

BACKGROUND

The inventive concept relates to a method of manufacturing an image sensor package, and more particularly, to a method of manufacturing an image sensor package including a transparent substrate.

Image sensors that take images and convert the images into electrical signals are used not only in consumer electronic devices, such as digital cameras, mobile phone cameras, and portable camcorders, but also in cameras mounted on automobiles, security devices, and robots. An image sensor is manufactured as an image sensor package including a transparent substrate to be used in various fields. As products using the image sensor package become smaller and more multifunctional, the image sensor package also requires miniaturization, low power, multi-function, high-speed signal processing, high reliability, low price, and clear picture quality.

SUMMARY

The inventive concept provides a method of manufacturing an image sensor package having miniaturization and high reliability.

According to an aspect of the inventive concept, there is provided a method of manufacturing an image sensor package, the method including preparing a device wafer including a plurality of chip portions and a scribe lane portion surrounding the plurality of chip portions, forming a redistribution pattern on a lower surface of the device wafer and a redistribution insulating film to cover a portion of the redistribution pattern and to cover a lower surface of the device wafer, forming an external connection terminal on a redistribution pad that is a portion of the redistribution pattern that is not covered by the redistribution insulating film, forming a preliminary dam pattern covering the scribe lane portion and a portion of an upper surface of the device wafer adjacent to the scribe lane portion, placing a preliminary transparent substrate on an upper surface of the device wafer on which the preliminary dam pattern is formed, performing a laser bonding process of radiating a laser beam to the preliminary dam pattern, and performing a singulation process forming individual image sensor packages each of which including a transparent substrate, a dam, and a residual scribe lane portion that is a portion of a chip portion and the scribe lane portion by cutting the preliminary transparent substrate, the preliminary dam pattern, and the scribe lane portion.

According to another aspect of the inventive concept, there is provided a method of manufacturing an image sensor package, the method including preparing a device wafer to which a first wafer including a plurality of image sensor chip portions and a first scribe lane portion surrounding the plurality of image sensor chip portions and a second wafer including a plurality of logic chip portions and a second scribe lane portion surrounding the plurality of logic chip portions are bonded, forming a preliminary dam pattern covering the first scribe lane portion and a portion of an upper surface of the first wafer adjacent to the first scribe lane portion, positioning a preliminary transparent substrate on the upper surface of the first wafer on which the preliminary dam pattern is formed, adhering the preliminary dam pattern to the device wafer and the preliminary transparent substrate by performing a laser bonding process of radiating a laser beam to the preliminary dam pattern, and performing a singulation process forming individual image sensor packages including a transparent substrate, a dam, and the image sensor chip portion and the logic chip portion by cutting the preliminary transparent substrate, the preliminary dam pattern, and the device wafer.

According to another aspect of the inventive concept, there is provided a method of manufacturing an image sensor package, the method including preparing a device wafer by bonding a first wafer and a second wafer together, the first wafer including a plurality of image sensor chip portions on which color filter arrays and micro lens arrays are sequentially disposed, and a first scribe lane portion surrounding each of the plurality of image sensor chip portions, the second wafer including a plurality of logic chip portions including a plurality of through electrodes, respectively, and a second scribe lane portion surrounding the plurality of logic chip portions, forming a preliminary dam pattern covering the first scribe lane portion and a portion of the upper surface of the first wafer adjacent to the first scribe lane portion, but not covering the color filter arrays and the micro lens arrays, positioning a preliminary transparent substrate on the upper surface of the first wafer on which the preliminary dam pattern is formed, adhering the preliminary dam pattern to the device wafer and the preliminary transparent substrate by performing a laser bonding process of radiating a laser beam to the preliminary dam pattern, and performing a singulation process forming individual image sensor packages each of which including a transparent substrate, a dam, an image sensor chip portion, and a logic chip portion by cutting the preliminary transparent substrate, the preliminary dam pattern, the first scribe lane portion, and the second scribe lane portion.

BRIEF DESCRIPTION OF THE DRAWINGS

Embodiments of the inventive concept will be more clearly understood from the following detailed description taken in conjunction with the accompanying drawings in which:

FIG. 2 is a cross-sectional view of an image sensor package according to an embodiment of the inventive concept;

FIG. 8 is a cross-sectional view of an image sensor package according to an embodiment of the inventive concept.

DETAILED DESCRIPTION OF THE EMBODIMENTS

Figure 1A:
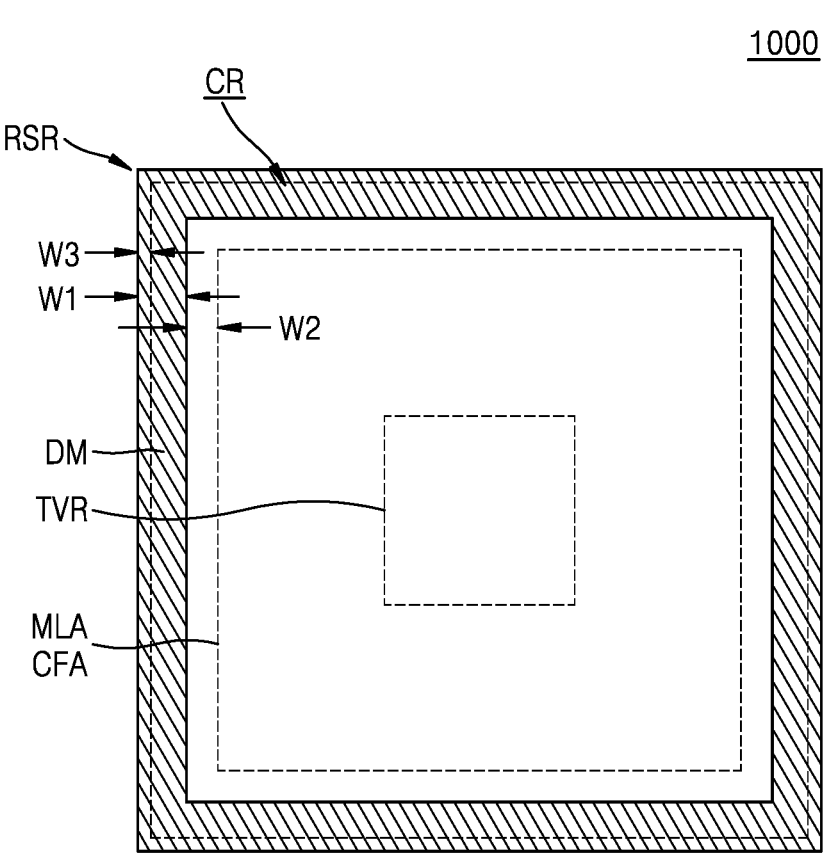
FIG. 1A is a schematic plan view of an image sensor package according to an embodiment of the inventive concept.
Figure 1B:
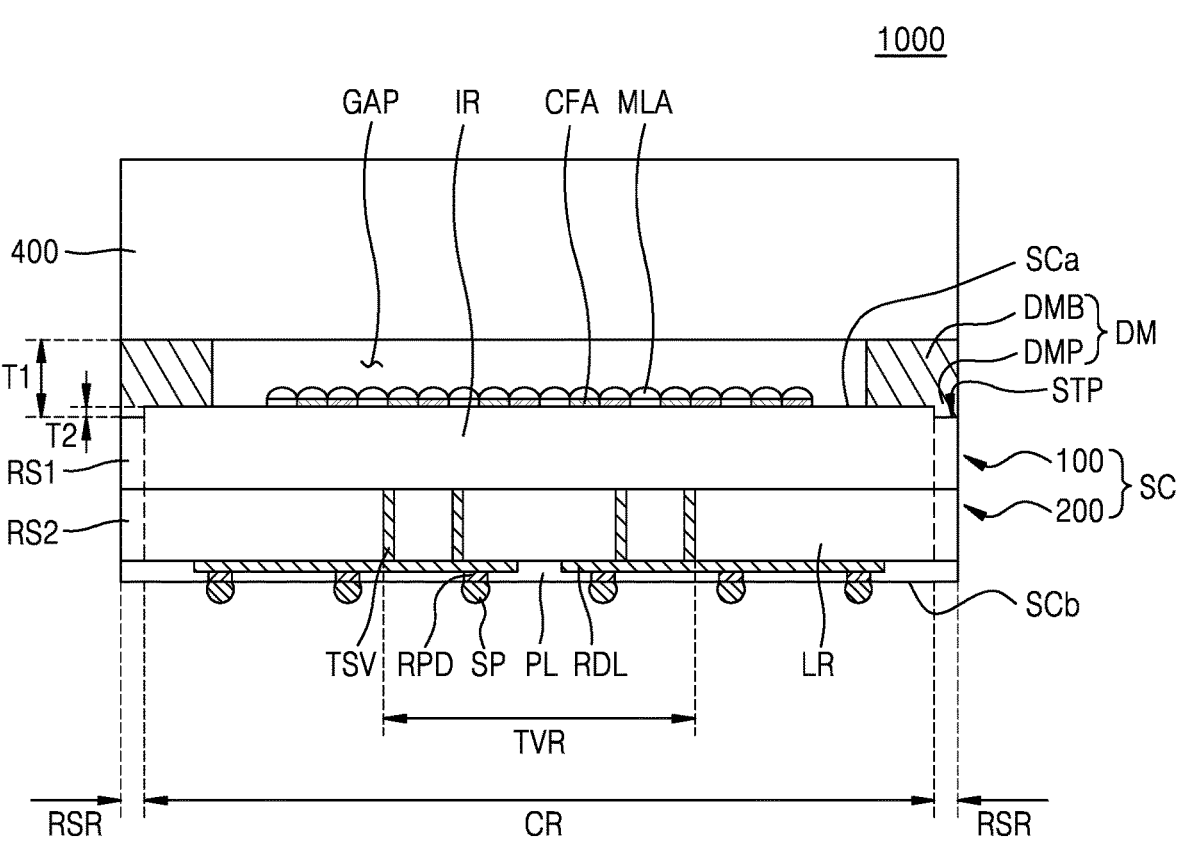
FIG. 1B is a cross-sectional view of an image sensor package according to an embodiment of the inventive concept.

FIG. 1A is a schematic plan view of an image sensor package according to an embodiment of the inventive concept, and FIG. 1B is a cross-sectional view of an image sensor package according to an embodiment of the inventive concept.

Referring to FIGS. 1A and 1B together, an image sensor package 1000 may include a semiconductor chip structure SC and a transparent substrate 400 disposed on the semiconductor chip structure SC. The semiconductor chip structure SC may have a first surface SCa and a second surface SCb that are opposite each other. The transparent substrate 400 may be disposed on/above the first surface SCa of the semiconductor chip structure SC. The transparent substrate 400 may be formed of a transparent material capable of introducing light for forming an image into the semiconductor chip structure SC. For example, the transparent substrate 400 may include or be formed of a transparent polymer material, such as acrylic or glass. In some embodiments, the transparent substrate 400 may include an infrared (IR) cut-off filter IRCF, and/or blue glass for an IR filter (blue glass, or blue filter). In some other embodiments, the transparent substrate 400 may be replaced with a film filter made of a silver film. However, the material of the transparent substrate 400 is not limited thereto, and may include a material configured to allow light for image formation to be incident on the semiconductor chip structure SC.

A horizontal area, e.g., a plan view area, of the transparent substrate 400 may be substantially equal to a horizontal area, e.g., a plan view area, of the semiconductor chip structure SC. For example, the horizontal areas of the transparent substrate 400 and the semiconductor chip structure SC may be substantially equal to each other, and respective side surfaces thereof may be aligned with each other so as to overlap each other in a vertical direction. For example, each of the transparent substrate 400 and the semiconductor chip structure SC may have a rectangular shape of plan view and each side surface of the transparent substrate 400 may be on the same plane as a corresponding side surface of the semiconductor chip structure SC.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

A dam DM may be disposed between the semiconductor chip structure SC and the transparent substrate 400. The dam DM may include or be formed of an insulating material. For example, the dam DM may include or be formed of dry film resist (DFR), epoxy, or an insulating material. In some embodiments, the dam DM may be formed using a thermoplastic resin. The dam DM is disposed along the edge of the first surface SCa of the semiconductor chip structure SC and may form a closed curve, e.g., a loop or a ring shape. An empty space GAP may be provided between the transparent substrate 400 and the semiconductor chip structure SC by the dam DM. The dam DM may be arranged between the semiconductor chip structure SC and the transparent substrate 400 to attach the transparent substrate 400 to the semiconductor chip structure SC. The dam DM may be adhered to and in contact with the semiconductor chip structure SC and may be adhered to and in contact with the transparent substrate 400. As described below, the dam DM may be adhered to the semiconductor chip structure SC and the transparent substrate 400 by a laser bonding process. The empty space GAP is sealed by the dam DM and may be disconnected/isolated from the outside. This prevents external moisture or contaminants from penetrating into the empty space GAP. For example, the empty space GAP may be in a vacuum state or may include or be filled with air or a gas (e.g., a processing gas).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The side surface of the transparent substrate 400, the side surface of the semiconductor chip structure SC, and the outer surface of the dam DM may be aligned (e.g., coplanar) with each other in a vertical direction.

The semiconductor chip structure SC may include an image sensor chip 100 adjacent to the first surface SCa and a logic chip 200 adjacent to the second surface SCb. As an example, a top surface of the image sensor chip 100 may be the first surface SCa of semiconductor chip structure SC and a bottom surface of the logic chip 200 may be the second surface SCb of semiconductor chip structure SC. The image sensor chip 100 may be in contact with the logic chip 200. The upper surface of the image sensor chip 100 may correspond to (e.g., the same as) the first surface SCa, and the lower surface of the logic chip 200 may correspond to (e.g., the same as) the second surface SCb. The side surface of the image sensor chip 100 and the side surface of the logic chip 200 may be aligned (e.g., coplanar) with each other in a vertical direction.

Spatially relative terms, such as "beneath," "below," "lower," "above," "upper," "top," "bottom" and the like, may be used herein for ease of description to describe positional relationships. It will be understood that the spatially relative terms encompass different orientations of the device in addition to the orientation depicted in the figures.

A micro lens array MLA may be disposed on the image sensor chip 100 to be adjacent to the transparent substrate 400, e.g., on a surface of the image sensor chip 100 facing the transparent substrate 400. The micro lens array MLA may include a plurality of hemispherical micro lenses. The micro lenses may focus light incident on the image sensor package 1000 to the image sensor chip 100. In some embodiments, the micro lenses may be formed of an organic material layer and an inorganic material layer that conformally covers the surface of the organic material layer. For example, the organic material layer may be made of a TMR-based resin (manufactured by Tokyo Ohka Kogyo, Co.) or an MFR-based resin (manufactured by Japan Synthetic Rubber Corporation).

A color filter array CFA may be disposed under the micro lens array MLA. The color filter array CFA may include a plurality of color filters. The color filter array CFA may have an arrangement of, for example, a Bayer structure including a red color filter, a blue color filter, and two green color filters in one unit array (e.g., in a unit dot), or a Tetra structure in which color filters of each color are arranged in a 2×2 array, or a Nona structure in which color filters of each color are arranged in a 3×3 array. The color filter may include, for example, a red (R) filter, a blue (B) filter, and a green (G) filter. Alternatively, the color filter may include a cyan (C) filter, a yellow (Y) filter, and a magenta (M) filter.

The logic chip 200 may include a plurality of through electrodes TSV passing through, e.g., in a vertical direction, at least a portion of the logic chip 200. The plurality of through electrodes TSV may be electrically connected to, e.g., contact, the redistribution pattern RDL. The redistribution pattern RDL may include a plurality of redistribution pads RPD disposed on the second surface SCb. A plurality of external connection terminals SP may be attached to the plurality of redistribution pads RPD respectively. Each of the plurality of external connection terminals SP may include or may be, for example, a conductive bump or a solder ball. The redistribution pattern RDL may be covered with a redistribution insulating film PL. The redistribution insulating film PL may include or be formed of at least one of silicon nitride, polyimide, and photo solder resist (PSR).

As used herein, components described as being "electrically connected" are configured such that an electrical signal can be transferred from one component to the other (although such electrical signal may be attenuated in strength as it transferred and may be selectively transferred).

The image sensor package 1000 may have a chip region CR and a residual scribe lane region RSR surrounding the chip region CR. For example, the residual scribe lane region RSR may be a region of scribe lane remaining at an edge of the image sensor package 1000 after performing a dicing process. The image sensor chip 100 may include a first chip portion IR and a first residual scribe lane portion RS1. The logic chip 200 may include a second chip portion LR and a second residual scribe lane portion RS2. The first chip portion IR and the second chip portion LR may be located in the chip region CR, and the first residual scribe lane portion RS1 and the second residual scribe lane portion RS2 may be located in the residual scribe lane region RSR. The first residual scribe lane portion RS1 may surround the first chip portion IR, and the second residual scribe lane portion RS2 may surround the second chip portion LR. The first chip portion IR and the second chip portion LR may be referred to as an image sensor chip portion and a logic chip portion, respectively.

In some embodiments, the first chip portion IR and the second chip portion LR may overlap each other in a vertical direction, and the first residual scribe lane portion RS1 and the second residual scribe lane portion RS2 may overlap each other in a vertical direction. For example, the first chip portion IR and the second chip portion LR may be the same area in a plan view, and the first residual scribe lane portion RS1 and the second residual scribe lane portion RS2 may have the same area in the plan view. The first residual scribe lane portion RS1 and the second residual scribe lane portion RS2 may be portions of the first scribe lane portion SR1 and the second scribe lane portion SR2 shown in FIGS. 3A to 3G.

The first chip portion IR and the second chip portion LR may be referred to as a chip portion together, and the first residual scribe lane portion RS1 and the second residual scribe lane portion RS2 may collectively be referred to as a residual scribe lane portion.

The dam DM may be located in the residual scribe lane region RSR and a portion of the chip region CR adjacent to the residual scribe lane region RSR. For example, the dam DM may have a first width W1 in a horizontal direction and may extend along an edge of the first surface SCa of the semiconductor chip structure SC. For example, the first width W1 may be about 300 μm to about 400 μm.

The semiconductor chip structure SC may have a step portion STP on the first surface SCa. The first surface SCa of the semiconductor chip structure SC may be at a lower vertical level in the step portion STP than the first surface SCa of other portions of the semiconductor chip structure SC. For example, the upper surface of the image sensor chip 100 in the step portion may be at a lower vertical level than the upper surface of other portions of the image sensor chip 100. In FIGS. 1A and 1B, although the step portion STP is shown to be located only in the residual scribe lane region RSR, that is, the first residual scribe lane portion RS1 of the image sensor chip 100, this is just an example and is not limited thereto. For example, the step portion STP may be positioned over a first residual scribe lane portion RS1 and a portion of the first chip portion IR adjacent to the first residual scribe lane portion RS1 of the image sensor chip 100. For example, the step portion STP may be disposed along the edge of the image sensor chip 100. For example, the step portion STP may be disposed along an edge of the image sensor chip 100 and form a closed curve, e.g., a loop or a ring shape. The horizontal width of the step portion STP may be greater than or equal to a third width W3 of the residual scribe lane region RSR and less than the first width W1. The first and third widths W1 and W3 may be widths in a horizontal direction perpendicular to a longitudinal direction of the residual scribe lane region RSR and/or a longitudinal direction of the dam DM.

The dam DM may fill the step portion STP. For example, the dam DM may completely fill from the top surface (e.g., the first surface SCa) of the step portion STP to the same level as or a higher level than the highest level the first surface SCa in a vertical direction above the step portion STP. The dam DM may include a base dam portion DMB at a higher vertical level than the uppermost end of the first surface SCa and a protruding dam portion DMB filling the step portion STP. The base dam portion DMB and the protruding dam portion DMP may be integrally formed, e.g., as one body. The base dam portion DMB may have a first thickness T1, e.g., in a vertical direction, and the protruding dam portion DMP may have a second thickness T2, e.g., in the vertical direction, that is less than the first thickness T1. For example, the first thickness T1 may be about 200 μm to about 300 μm, and the second thickness T2 may be several μm or less. Therefore, in the dam DM, in top view, the thickness of the portion adjacent to the edge of the image sensor package 1000 may have a greater value than the thickness of the portion located inside thereof, and the dam DM may protrude downward from a portion adjacent to the edge of the image sensor package 1000. Both the base dam portion DMB and the protruding dam portion DMP fill a space between the side surface of the transparent substrate 400 and the side surface of the semiconductor chip structure SC. For example, side surfaces of the dam DM, the semiconductor chip structure SC, and the transparent substrate 400 may be coplanar with each other. Therefore, the image sensor package 1000 may not include an encapsulation material covering the outer surface of the dam DM between the transparent substrate 400 and the semiconductor chip structure SC, and thus, the volume of the image sensor package 1000 may be reduced when compared with an image sensor package encapsulated by an encapsulation material, and accordingly, miniaturization of the image sensor package 1000 may be achieved.

A micro lens array MLA and a color filter array CFA may be disposed in the first chip portion IR. Each of the micro lens array MLA and the color filter array CFA may be horizontally spaced apart from the dam DM. Each of the micro lens array MLA and the color filter array CFA may be spaced apart from the dam DM while having a second width W2 between the dam DM and each of the micro lens array MLA and the color filter array CFA in the horizontal direction. In some embodiments, the second width W2 may have a smaller value than the first width W1. For example, the second width W2 may be about 150 μm to about 250 μm.

The residual scribe lane region RSR has a third width W3 in the horizontal direction and may extend along the periphery of the chip region CR. The residual scribe lane region RSR may form a closed curve, e.g., a ring shape, surrounding the chip region CR. In some embodiments, the third width W3 may have a smaller value than the second width W2. For example, the third width W3 may be about 10 μm to about 80 μm.

The through electrode region TVR may be located in the chip region CS. In some embodiments, the through electrode region TVR may be located in a central portion of the chip region CS, e.g., in a top-view. The through electrode region TVR may vertically overlap each of the micro lens array MLA and the color filter array CFA. The through electrode region TVR may be positioned in a central portion of each of the micro lens array MLA and the color filter array CFA in a top-view. The plurality of through electrodes TSV may be disposed in the through electrode region TVR. The plurality of through electrodes TSV may pass through at least a portion of the second chip portion LR, e.g., in a vertical direction, to be electrically connected to the first chip portion IR.

In the image sensor package 1000, there is no conductive pad on the first surface SCa of the semiconductor chip structure SC to be electrically connected to a bonding wire. Instead, the image sensor package 1000 may be electrically connected to an external device through an external connection terminal SP electrically connected to a through electrode TSV passing through at least a portion of the logic chip 200. For example, the image sensor package 1000 may be electrically connected to an external device by a flip-chip bonding method. In addition, the plurality of through electrodes TSV may be disposed in the second chip portion LR vertically overlapping with each of the micro lens array MLA and the color filter array CFA, and may not be disposed in the first chip portion IR.

Accordingly, a signal transmission speed between the image sensor package 1000 and an external device may be improved. In addition, in relation to the image sensor package 1000, since no additional space is required for bonding wires on the first chip portion IR and a space for disposing a plurality of through electrodes TSV around the micro lens array MLA and the color filter array CFA is not required in the first chip portion IR, miniaturization of the image sensor package may be achieved.

Figure 2:
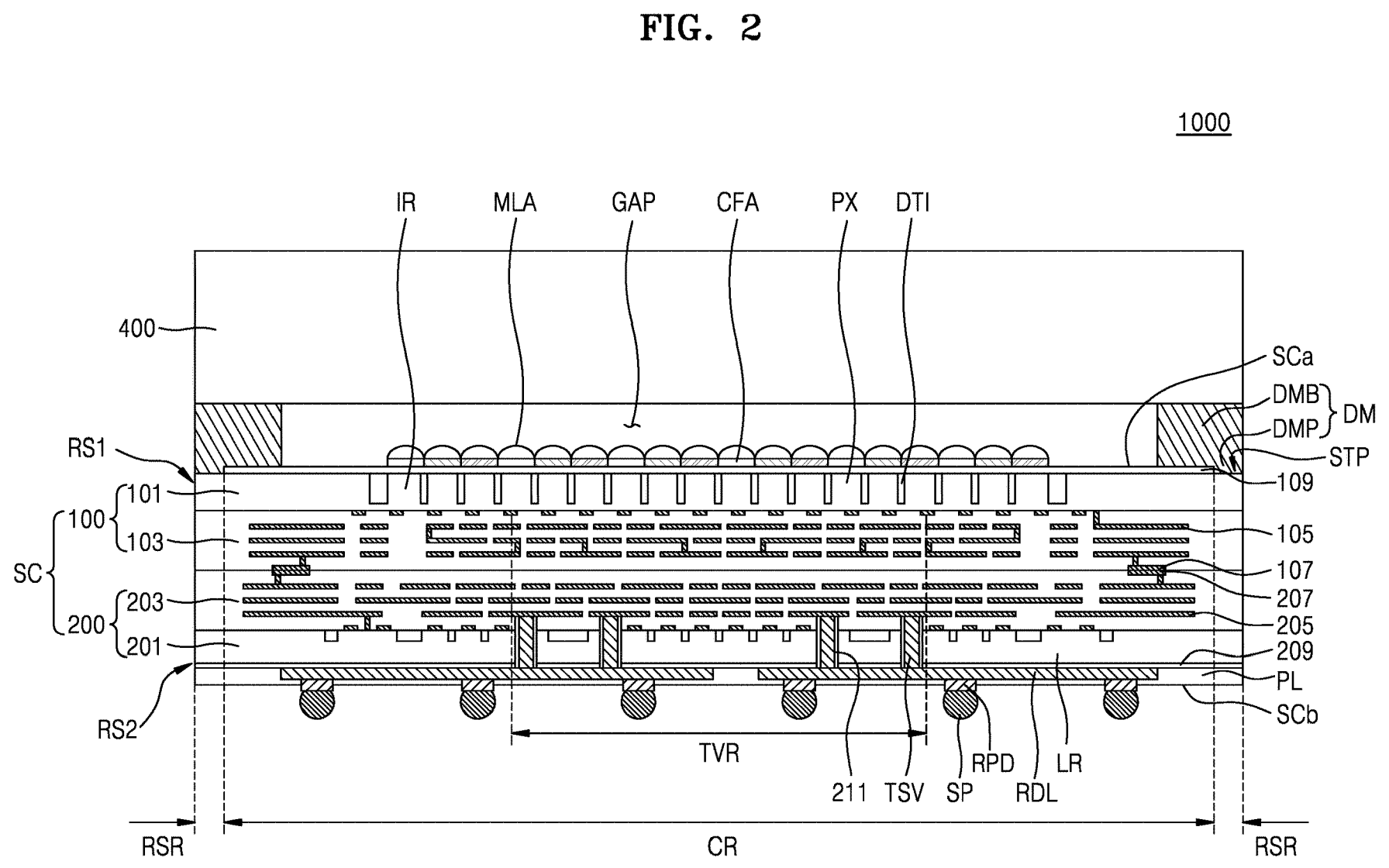

FIG. 2 is a cross-sectional view of an image sensor package according to an embodiment of the inventive concept. For example, FIG. 2 may be a detailed view of FIG. 1B.

Referring to FIG. 2, the image sensor chip 100 may include a first substrate 101 and a first interlayer insulating film 103. The first substrate 101 may include or may be a semiconductor substrate. For example, the first substrate 101 may include or be formed of a group IV semiconductor material, a group III-V semiconductor material, or a group II-VI semiconductor material. The group IV semiconductor material may include or may be, for example, silicon (Si), germanium (Ge), or silicon germanium (SiGe). The III-V group semiconductor material may include or may be, for example, gallium arsenide (GaAs), indium phosphorus (InP), gallium phosphorus (GaP), indium arsenic (InAs), indium antimony (InSb), or indium gallium arsenide (InGaAs). The II-VI semiconductor material may include or may be, for example, zinc telluride (ZnTe) or cadmium sulfide (CdS).

In some embodiments, the first substrate 101 may be formed of a P-type silicon substrate. In some other embodiments, the first substrate 101 may include a P-type bulk substrate and a P-type or N-type epitaxial layer grown thereon. In some other embodiments, the first substrate 101 may include an N-type bulk substrate and a P-type or N-type epitaxial layer grown on the N-type bulk substrate. In some other embodiments, the first substrate 101 may be formed of an organic plastic substrate.

The first interlayer insulating film 103 may have a single-layer or multi-layer structure of at least one of a silicon nitride film, a silicon oxide film, a silicon oxynitride film, and a porous insulating film. A deep device isolation film DTI may be disposed on the first substrate 101 to separate a plurality of pixel areas PX from each other. Each of the plurality of pixel areas PX may include, for example, a CMOS image sensor (CIS) or a charge-coupled device (CCD). In some embodiments, the plurality of pixel areas PX may be arranged in a matrix form, e.g., in a top-view. The deep device isolation film DTI may have a lattice form in a top-view. The deep device isolation film DTI may include or be formed of at least one of a silicon oxide film and a fixed charge film. In some embodiments, the deep device isolation film DTI may further include a polysilicon pattern spaced apart from the first substrate 101. In some embodiments, the deep device isolation film DTI may further include an airgap region, e.g., a region filled with air or a gas (e.g., a processing gas), or a region in a vacuum state. In each pixel area PX separated by the deep device isolation film DTI, a photoelectric conversion unit may be disposed on the substrate 101. The photoelectric conversion unit may be doped with impurities of a conductivity type that is different from the impurities doped on the first substrate 101.

An upper surface of the first substrate 101 may be covered with a first passivation film 109. The first passivation film 109 may serve as or may be an anti-reflection film. The first passivation film 109 may include or may be, for example, a silicon nitride film. In some embodiments, a fixed charge film may be arranged/disposed between the first passivation film 109 and the first substrate 101. The fixed charge film may include or be formed of at least one metal oxide film selected from an aluminum oxide film, a tantalum oxide film, and a hafnium oxide film. The color filter array CFA may be disposed on the first passivation film 109. A micro lens array MLA may be disposed on the color filter array CFA.

Gate electrodes, contact plugs, via plugs, and first wirings 105 may be disposed in the first interlayer insulating film 103. A first conductive pad 107 electrically connected to the first wirings 105 may be disposed in the first interlayer insulating film 103. The first conductive pad 107 may contain or be formed of a metal, such as copper, aluminum, and tungsten. A lower surface of the first conductive pad 107 may be coplanar with a lower surface of the first interlayer insulating film 103.

The logic chip 200 may include circuits for driving the image sensor chip 100. The logic chip 200 may include a second substrate 201 and a second interlayer insulating film 203. The second substrate 201 may include or may be a semiconductor substrate. For example, the second substrate 201 may include or be formed of a group IV semiconductor material, a group III-V semiconductor material, or a group II-VI semiconductor material. A shallow device isolation film may be disposed on the second substrate 201 to define an active region. The second substrate 201 may be made/formed of the same material as or a similar material to the first substrate 101. The second interlayer insulating film 203 may have a single-layer or multi-layer structure of at least one of a silicon nitride film, a silicon oxide film, a silicon oxynitride film, and a porous insulating film. Gate electrodes, contact plugs, via plugs, and second wirings 205 may be disposed in the second interlayer insulating film 203. A second conductive pad 207 electrically connected to the second wirings 205 may be disposed in the second interlayer insulating film 203. The second conductive pad 207 may include or be formed of a metal, such as copper, aluminum, and tungsten. The upper surface of the second conductive pad 207 may be coplanar with the upper surface of the second interlayer insulating film 203. The first interlayer insulating film 103 may be in contact with the second interlayer insulating film 203. The first conductive pad 107 may contact the second conductive pad 207. Alternatively, there may be no boundary line between the first conductive pad 107 and the second conductive pad 207, and the first conductive pad 107 and the second conductive pad 207 may form a single integrated conductive pattern. After the first conductive pad 107 and the second conductive pad 207 corresponding to each other expand by heat and come into contact with each other, they may be bonding pads that are diffusion bonded so as to form an integral body through diffusion of the included metal atoms. For example, the image sensor chip 100 and the logic chip 200 may be stacked using a metal-oxide hybrid bonding method.

An active region (not shown) and a floating diffusion region may be disposed on a lower surface of the first substrate 101. In some embodiments, gate electrodes constituting a plurality of transistors may be disposed on a lower surface of the first substrate 101. For example, the plurality of transistors may include a transfer transistor configured to transfer charge generated by the photoelectric conversion unit to the floating diffusion region, a reset transistor configured to periodically reset charge stored in the floating diffusion region, a drive transistor serving as a source follower buffer amplifier and configured to buffer a signal according to charges stored in the floating diffusion region, and a selection transistor serving as a switch and for addressing and selecting the pixel area PX. However, the plurality of transistors are not limited thereto.

In some embodiments, a transfer gate constituting the transfer transistor may be formed of a recess gate type extending from the lower surface of the first substrate 101 into the first substrate 101, but is not limited thereto.

In some other embodiments, a reset gate constituting a reset transistor among the plurality of transistors, a source follower gate constituting a drive transistor, and a selection gate constituting the selection transistor may be formed on the second substrate 201 to be included in the logic chip 200.

The plurality of through electrodes TSV may be disposed in the through electrode region TVR. The plurality of through electrodes TSV may pass through at least a portion of the second substrate 201 and the second interlayer insulating film 203, e.g., in a vertical direction, to be electrically connected to some of the second wirings 205. The through electrode TSV may contain or be formed of metals, such as copper, aluminum, and tungsten. A via insulating film 211 may be arranged/formed between the through electrode TSV and the second substrate 201. A lower surface of the second substrate 201 may be covered with a second passivation film 209. The second passivation film 209 may include or may be, for example, a silicon nitride film.

The redistribution pattern RDL may be disposed on the second passivation film 209. The redistribution pattern RDL may contain or be formed of metals, such as copper, aluminum, and tungsten. In some embodiments, the through electrode TSV may vertically extend from the second substrate 201 to entirely penetrate the second interlayer insulating film 203. In some other embodiments, the through electrode TSV may vertically extend from the second substrate 201 to penetrate the second interlayer insulating film 203 and extend into the first interlayer insulating film 103.

The through electrode TSV may not extend into the first substrate 101 of the image sensor chip 100. A plurality of pixel areas PX are disposed in the center of the first substrate 101, so that it may be difficult to arrange/form the through electrodes TSV in the first substrate 101. However, in the inventive concept, since the through electrode TSV is formed in the logic chip 200, the through electrode TSV may be formed at any position, e.g., in a place vertically overlapping the pixel areas PX, regardless of the positions of the pixel areas PX. This may improve wiring freedom. For example, the through electrode TSV may vertically overlap the pixel areas PX, the color filter array CFA, and the color filter array CFA.

The upper surface of the first passivation film 109 may correspond to or may be the first surface SCa of the semiconductor chip structure SC, and the lower surface of the redistribution insulating film PL may correspond to or may be the second surface SCb of the semiconductor chip structure SC.

FIGS. 3A to 3G are cross-sectional views illustrating a method of manufacturing an image sensor package, according to an embodiment.

Figure 3A:
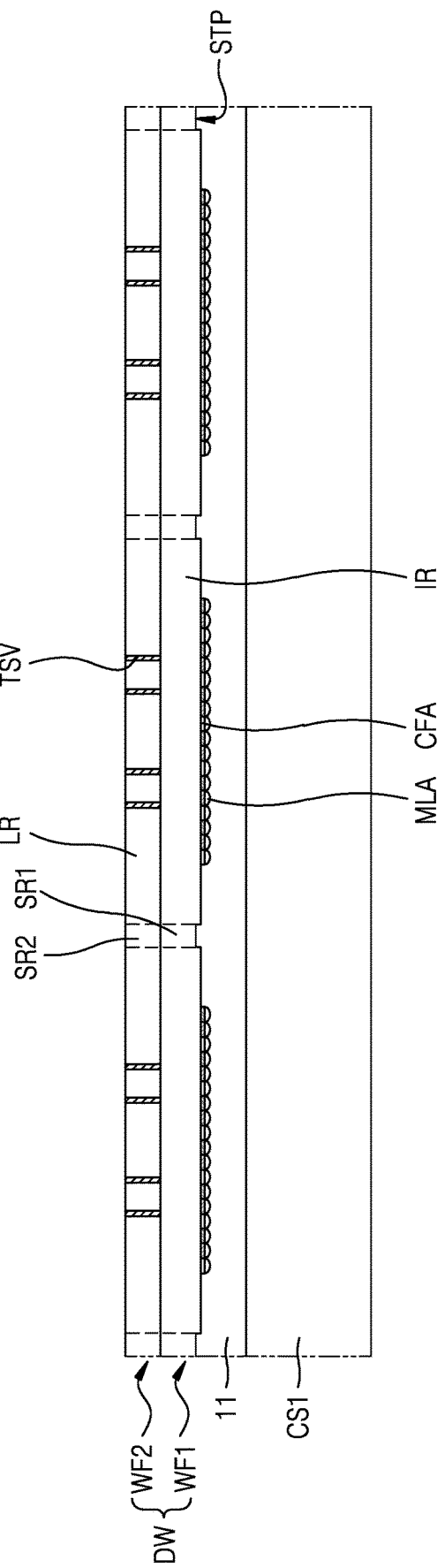
FIGS. 3A, 3B, 3C, 3D, 3E, 3F, and 3G are cross-sectional views illustrating a method of manufacturing an image sensor package, according to an embodiment.

Referring to FIGS. 2 and 3A together, a first wafer WF1 may be attached on the first carrier substrate CS1 by a wafer support system (WSS) process. For example, the wafer support system (WSS) process may be a process performed by using a wafer support system (WSS) which is designed to temporarily bond wafers/substrates together. A first bonding means 11 may be arranged between the first carrier substrate CS1 and the first wafer WF1. For example, the first bonding means 11 may be a bonding layer. In some embodiments, the first bonding means 11 may have a structure in which adhesive layers and release layers are alternately stacked. One of the adhesive layer and the release layer may include a material that is thermally decomposable or decomposable by ultraviolet light. The release layer may have a lower content of the crosslinking agent than the adhesive layer.

The first wafer WF1 may include a first scribe lane portion SR1 and a plurality of first chip portions IR. The plurality of first chip portions IR may be arranged in a matrix form in a top-view, and the first scribe lane portion SR1 surrounds each of the plurality of first chip portions IR and may have a lattice form in a top-view. Each first chip portion IR may include a first substrate 101 and a first interlayer insulating film 103.

A micro lens array MLA and a color filter array CFA may be disposed in each of the plurality of first chip portions IR. The micro lens array MLA may be in contact with the first bonding means 11 and be embedded in the first bonding means 11.

The first wafer WF1 may have a step portion STP in the first scribe lane portion SR1. Although it is illustrated in FIG. 3A that the step portion STP is positioned only on the first scribe lane portion SR1 of the first wafer WF1, this is not limited thereto. For example, the step portion STP may be positioned over the first scribe lane portion SR1 of the first wafer WF1 and a portion of the first chip portion IR adjacent to the first scribe lane portion SR1. For example, the step portion STP may be disposed along the edge of the first chip portion IR.

The second wafer WF2 may include a second scribe lane portion SR2 and a plurality of second chip portions LR. The plurality of second chip portions LR may be arranged in a matrix form in a top-view, and the second scribe lane portion SR2 surrounds the plurality of second chip portions LR and may have a lattice form in a top-view. The second chip portion LR may include a second substrate 201 and a second interlayer insulating film 203. For example, the second chip portion LR of the second wafer WF2 may be a portion in which semiconductor devices and/or circuits are formed, and the second scribe lane portion SR2 of the second wafer WF2 may be a portion in which no semiconductor devices and no circuits are formed thereby not overlapping any semiconductor devices or circuits in a vertical direction.

The first wafer WF1 and the second wafer WF2 may be bonded by performing a thermo-compression process. At this time, the second wafer WF2 may be positioned on the first wafer WF1 so that the first scribe lane portion SR1 of the first wafer WF1 and the second scribe lane portion SR2 of the second wafer WF2 overlap in a vertical direction. The first interlayer insulating film 103 included in the first wafer WF1 and the second interlayer insulating film 203 included in the second wafer WF2 may be positioned to be in contact with each other. Also, the first conductive pad 107 included in the first wafer WF1 and the second conductive pad 207 included in the second wafer WF2 may contact each other. The first wafer WF1 and the second wafer WF2 may constitute a device wafer DW.

In some embodiments, after attaching the second wafer WF2 to the first wafer WF1, a grinding process may be performed on the result to reduce the thickness of the second wafer WF2. A portion of the second substrate 201 included in the second wafer WF2 may be removed by the grinding process. A second passivation film 209 may be formed on the second substrate 201. Thereafter, the second passivation film 209, the second substrate 201, and the second interlayer insulating film 203 of the second wafer WF2 are etched to form a plurality of through holes and form a via insulating film 211 covering/contacting a side surface of each of the plurality of through holes. The via insulating film 211 may be formed through deposition and etching processes. The via insulating film 211 may include or may be a silicon oxide film or a silicon nitride film. In addition, a plurality of through electrodes TSV may be formed by filling the plurality of through holes with a conductive film and performing a chemical mechanical polishing (CMP) process.

In some other embodiments, before attaching the second wafer WF2 to the first wafer WF1, the second substrate 201 and the second interlayer insulating film 203 may be etched to form a plurality of through holes and a via insulating film 211 covering/contacting a side surface of each of the plurality of through holes. In addition, a plurality of through electrodes TSV may be formed by filling the plurality of through holes with a conductive film. Thereafter, after attaching the second wafer WF2 on the first wafer WF1, a grinding process may be performed to reduce the thickness of the second wafer WF2 to expose the plurality of through electrodes TSV. After removing a portion of the second substrate 201 so that the plurality of through electrodes TSV protrude from the second substrate 201, a second passivation film 209 may be formed on the second substrate 201. The second passivation film 209 may be formed to surround/contact side surfaces of portions of the plurality of through electrodes TSV protruding from the second substrate 201.

The plurality of through electrodes TSV may be formed to vertically overlap the micro lens array MLA and the color filter array CFA. The plurality of through electrodes TSV may be formed to pass through at least a portion of the second chip portion LR to be electrically connected to the first chip portion IR.

The first chip portion IR of the first wafer WF1 and the second chip portion LR of the second wafer WF2 may be collectively referred to as a chip portion of the device wafer DW, and the first scribe lane portion SR1 of the first wafer WF1 and the second scribe lane portion SR2 of the second wafer WF2 may be collectively referred to as a scribe lane portion of the device wafer DW. The device wafer DW may include a plurality of chip portions arranged in a matrix form in a top-view, and a scribe lane portion that surrounds the plurality of chip portions and has a grid shape in a top-view. The upper surface of the first passivation film 109 may be referred to as the upper surface of the device wafer DW, or the upper surface of the first wafer WF1, and the lower surface of the second passivation film 209 may be referred to as the lower surface of the device wafer DW or the lower surface of the second wafer WF2. For example, the plurality of through electrodes TSV may be formed to vertically extend from the lower surface of the device wafer DW into the device wafer DW. For example, the plurality of through electrodes TSV may be formed to extend from the lower surface of the second wafer WF2 into the second chip portion LR, e.g., in a vertical direction.

Figure 3B:
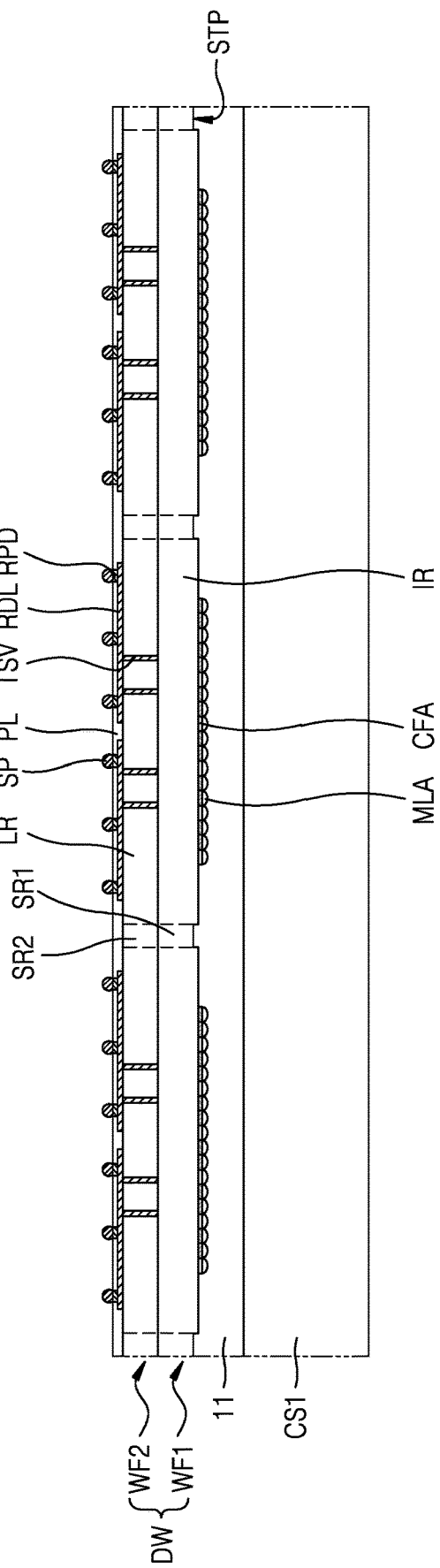

Referring to FIGS. 2 and 3B together, a redistribution pattern RDL and a redistribution insulating film PL are formed on the lower surface of the device wafer DW. The redistribution pattern RDL may be formed by laminating and patterning a conductive film on the second passivation film 209. The redistribution pattern RDL may be formed to be in contact with the through electrode TSV. In addition, a redistribution insulating film PL covering the redistribution pattern RDL and the second passivation film 209 is formed. The redistribution insulating film PL may be formed to cover the second passivation film 209 and cover a portion of the redistribution pattern RDL. For example, the redistribution insulating film PL may contact a bottom surface and a side surface of the redistribution pattern RDL and a bottom surface of the second passivation film 209. The redistribution insulating film PL may include or be formed of at least one of a silicon nitride film, polyimide, and PSR. The redistribution pattern RDL may include a plurality of redistribution pads RPD disposed on the second surface SCb. The plurality of redistribution pads RPD may be portions exposed without being covered by the redistribution insulating film PL among the redistribution patterns RDL. In some embodiments, the redistribution pattern RDL and the redistribution insulating film PL may be formed by repeating at least twice. For example, two or more redistribution pattern RDL layers and two or more redistribution insulating films PL may be alternately formed by repeating identical processes two or more times. A plurality of external connection terminals SP may be formed on the plurality of redistribution pads RPD of the redistribution pattern RDL. For example, the plurality of external connection terminals 400 may be disposed on the second surface SCb.

The first carrier substrate CS1 may be separated from the device wafer DW. For example, a physical force may be applied between the first carrier substrate CS1 and the first bonding means 11 to separate the first carrier substrate CS1 from the device wafer DW. In some embodiments, the portion of the first bonding means 11 remaining on the device wafer DW may be removed by radiating ultraviolet rays (UV) or applying heat thereto. The adhesive layer or release layer included in the first bonding means 11 may be decomposed and removed by UV or heat.

Figure 3C:
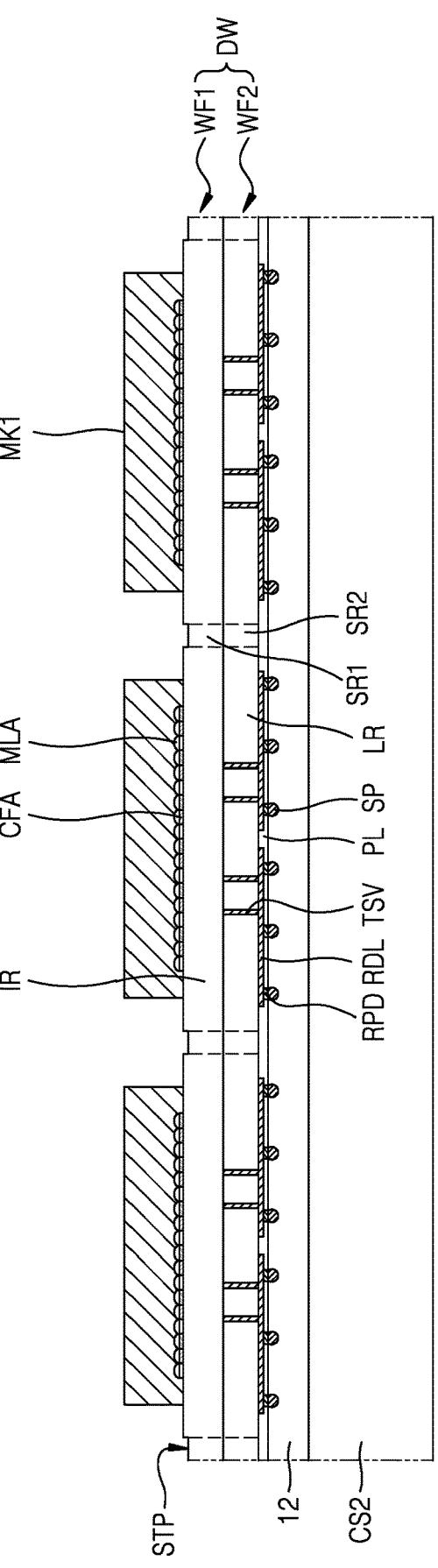

Referring to FIG. 3C also, as the device wafer DW separated from the first carrier substrate CS1 is turned over, the second wafer WF2 faces the second carrier substrate CS2 such that the second wafer WF2 may be attached to the second carrier substrate CS2 by a wafer support system (WSS) process. A second bonding means 12 may be arranged between the second carrier substrate CS2 and the device wafer DW. For example, the second bonding means 12 may be a bonding layer. In some embodiments, the second bonding means 12 may have a structure in which adhesive layers and release layers are alternately stacked. The plurality of external connection terminals SP and the redistribution insulating film PL may contact the second bonding means 12. The plurality of external connection terminals SP may be protected by being wrapped by the second bonding means 12.

A first mask pattern MK1 is formed on the upper surface of the device wafer DW. The first mask pattern MK1 may be formed on the first wafer WF1. The first mask pattern MK1 may be formed to cover the micro lens array MLA and the color filter array CFA but not to cover the first scribe lane portion SR1. For example, the first mask pattern MK1 may be formed not to cover the first scribe lane portion SR1 and a portion of the first chip portion IR adjacent to the first scribe lane portion SR1, and cover the remaining portion of the first chip portion IR. For example, the first chip portion IR of the first wafer WF1 may be a portion in which semiconductor devices and/or circuits are formed, and the first scribe lane portion SR1 of the first wafer WF1 may be a portion in which no semiconductor devices and no circuits are formed thereby not overlapping any semiconductor devices or circuits in a vertical direction.

Figure 3D:
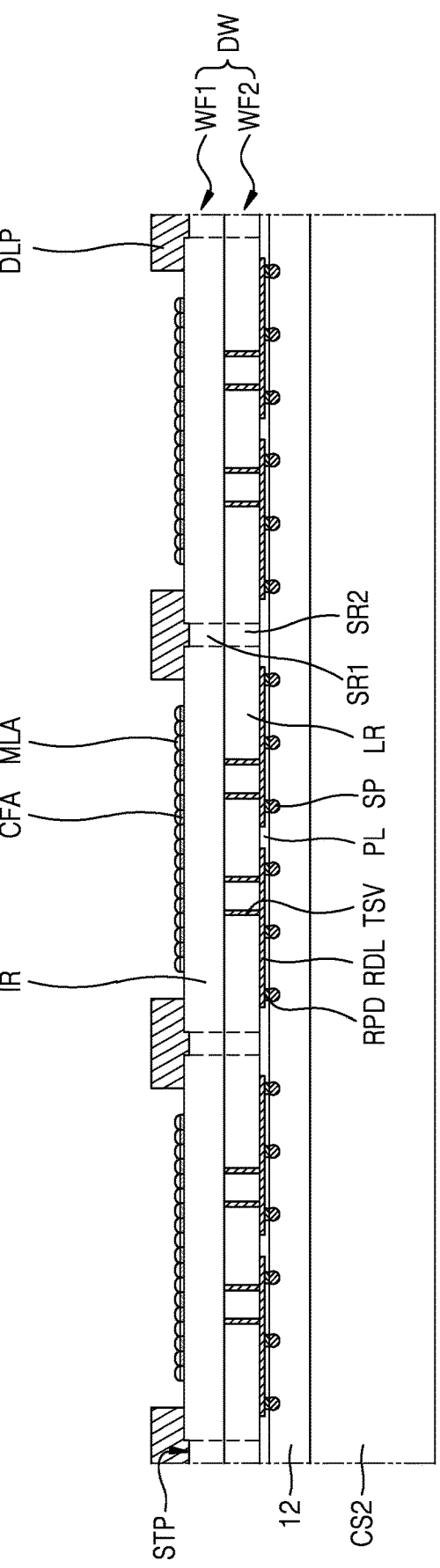

Referring to FIGS. 3C and 3D together, after forming a dam material layer on the first wafer WF1 on which the first mask pattern MK1 is formed, a lift-off process of removing the first mask pattern MK1 is performed to form the preliminary dam pattern DLP. In the process of removing the first mask pattern MK1, a portion of the dam material layer positioned on the first mask pattern MK1 is removed, such that the remaining portion of the dam material layer may remain on the first wafer WF1 as a preliminary dam pattern DLP. The preliminary dam pattern DLP may be formed to cover the first scribe lane portion SR1 and a portion of the first chip portion IR adjacent to the first scribe lane portion SR1, and not to cover the remaining portion of the first chip portion IR including the micro lens array MLA and the color filter array CFA. The preliminary dam pattern DLP may be formed to fill the step portion STP.

In some embodiments, the preliminary dam pattern DLP may include or be formed of a thermoplastic resin. For example, the preliminary dam pattern DLP may include or be formed of a semi-crystalline material such as polyethylene (PE), polypropylene (PP), polyamiden (PA) or polyetheretherketone (PEEK), or an amorphous material such as polycarbonate (PC), polymethylmethacrylate (PMMA), or polystyrene (PS).

Figure 3E:
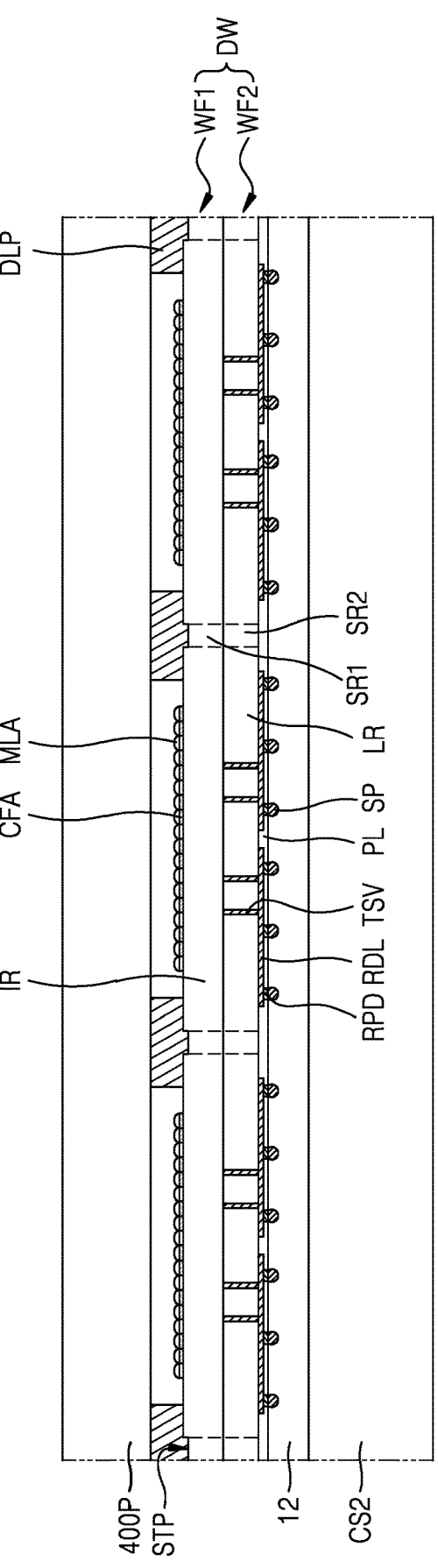

Referring to FIG. 3E, a preliminary transparent substrate 400P is positioned on the first wafer WF1 on which the preliminary dam pattern DLP is formed. The preliminary transparent substrate 400P and the first wafer WF1 may be spaced apart by the preliminary dam pattern DLP, and the preliminary transparent substrate 400P may not contact the micro lens array MLA and the color filter array CFA.

Figure 3F:
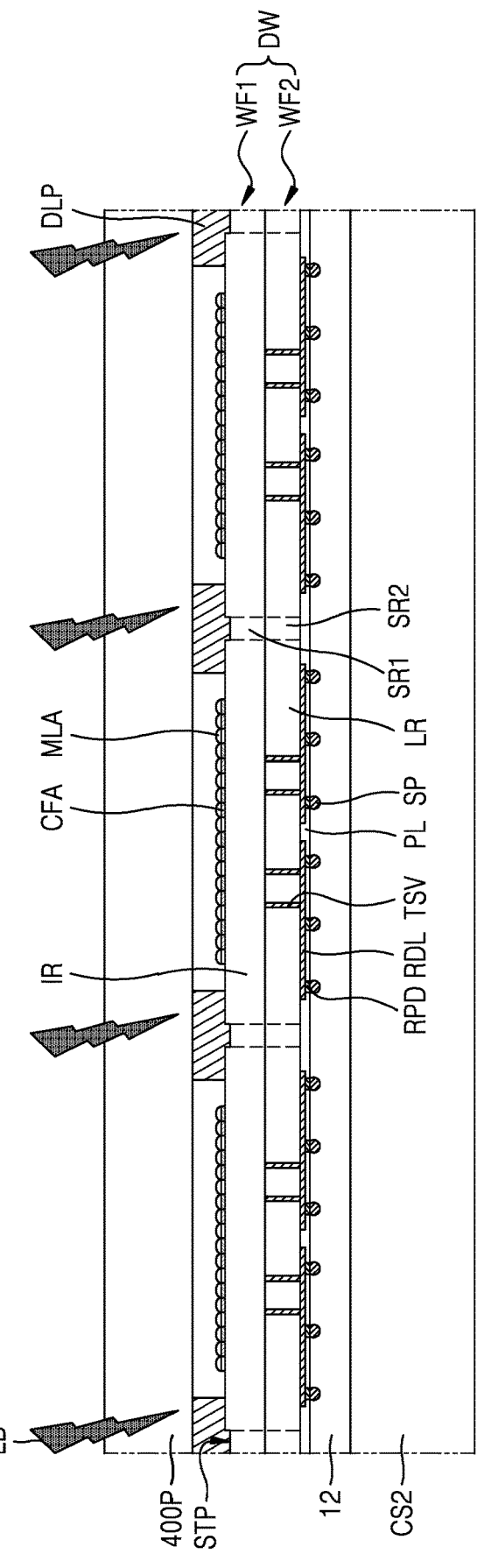

Referring to FIG. 3F, a laser bonding process of irradiating the preliminary dam pattern DLP with a laser beam BL through the preliminary transparent substrate 400P is performed, such that the preliminary dam pattern DLP is adhered to the first wafer WF1 and the preliminary transparent substrate 400P.

The laser beam BL may have a wavelength of about 750 nm to about 1500 nm. For example, the laser beam BL may be provided from a laser diode, a fiber laser, or an Nd:YAG laser. Alternatively, the laser beam BL may be provided from a $CO_2$ laser having a wavelength of 10.6 μm.

Figure 3G:
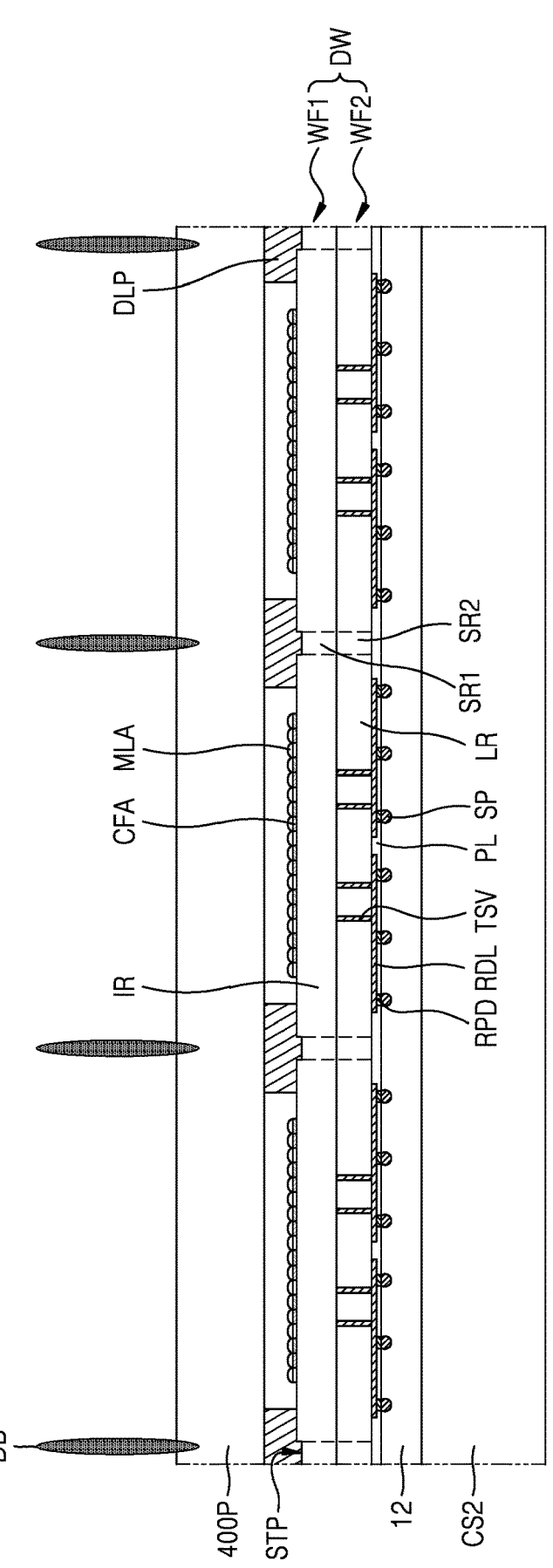

Referring to FIGS. 3F and 3G together, after performing a singulation process on the result of FIG. 3F, the image sensor package 1000 shown in FIGS. 1A, 1B, and 2 may be formed by separating the result of the singulation process (e.g., singulated image sensor packages) from the second carrier substrate CS2. The singulation process may be performed to cut the preliminary transparent substrate 400P, the preliminary dam pattern DLP, the first scribe lane portion SR1, and the second scribe lane portion SR2 using a dicing blade DB or a laser blade.

After the singulation process, one portion of the first scribe lane portion SR1 and one portion of the second scribe lane portion SR2 may be a first residual scribe lane portion RS1 and a second residual scribe lane portion RS2, respectively, surrounding the first chip portion IR and the second chip portion LR, and a portion of the preliminary dam pattern DLP may form the dam DM, and a portion of the preliminary transparent substrate 400P may form the transparent substrate 400.

Referring to FIGS. 1 to 3G together, the dam DM included in the image sensor package 1000 according to the inventive concept is formed by performing a photolithography process and bonded to the semiconductor chip structure SC and the transparent substrate 400 by performing a laser bonding process. Therefore, unlike the dam formed through the application of glue, the tolerance of the width of the dam DM, that is, the first width W1, is reduced. In addition, since the tolerance of the width of the dam DM is reduced, the separation distance, that is, the second width W2, between each of the micro lens array MLA and the color filter array CFA and the dam DM may be minimized. Accordingly, the image sensor package 1000 may be miniaturized. In addition, since heat treatment for curing the glue is not required, warpage may not occur in the image sensor package 1000 and sensitivity deterioration of the image sensor package 1000 may not occur.

Figure 4:
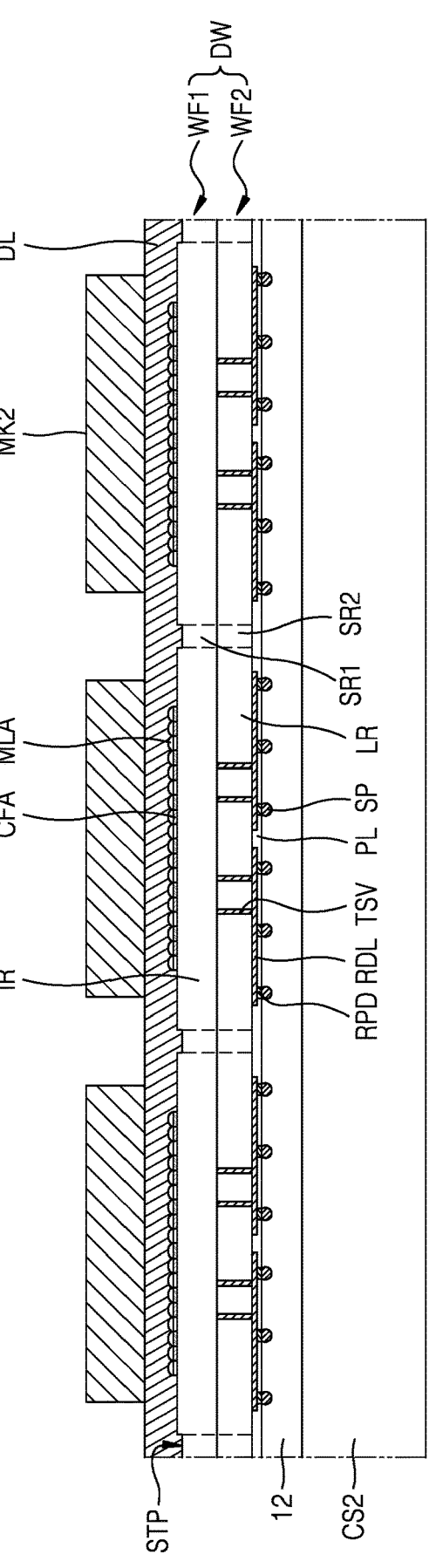
FIG. 4 is a cross-sectional view illustrating a method of manufacturing an image sensor package, according to an embodiment of the inventive concept.

FIG. 4 is a cross-sectional view illustrating a method of manufacturing an image sensor package, according to an embodiment of the inventive concept. For example, FIG. 4 is a cross-sectional view illustrating an operation subsequent to FIG. 3B.

Referring to FIG. 4, after the dam material layer DL is formed on the first wafer WF1, the second mask pattern MK2 is formed on the dam material layer DL. The dam material layer DL may be formed to cover the entire upper surface of the first wafer WF1. For example, the dam material layer DL may be formed to cover the first chip portion IR including the micro lens array MLA and the color filter array CFA, and the first scribe lane portion SR1.

The second mask pattern MK2 may be formed to cover a portion of the dam material layer DL covering the micro lens array MLA and the color filter array CFA, and not to cover a portion of the dam material layer DL covering the first scribe lane portion SR1.

Thereafter, using the second mask pattern MK2 as an etch mask, a portion of the dam material layer DL not covered by the second mask pattern MK2 is removed, such that as shown in FIG. 3D, a preliminary dam pattern DLP is formed. Thereafter, the image sensor package 1000 shown in FIGS. 1A, 1B, and 2 may be formed with reference to FIGS. 3E to 3G.

Figure 5:
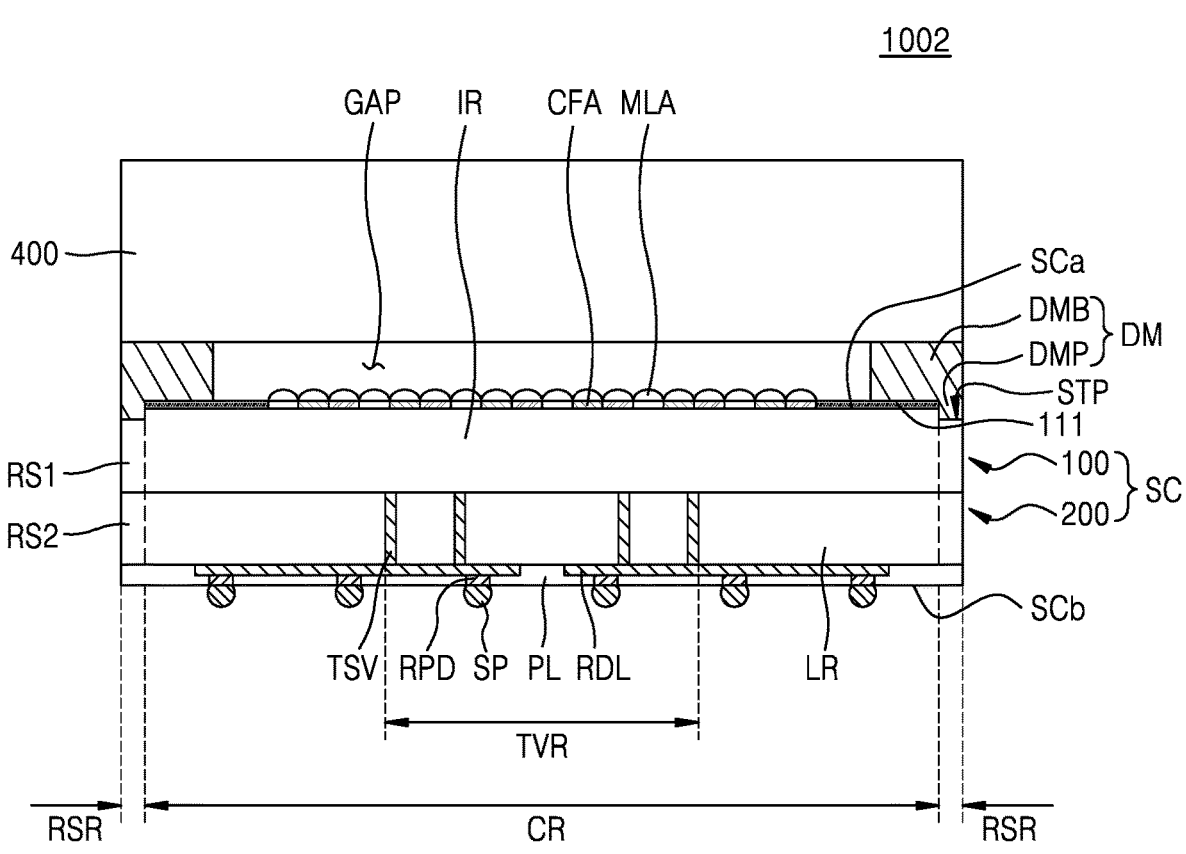
FIG. 5 is a cross-sectional view of an image sensor package according to an embodiment of the inventive concept.

FIG. 5 is a cross-sectional view of an image sensor package according to an embodiment of the inventive concept.

Referring to FIGS. 2 and 5 together, in the image sensor package 1002, a light blocking pattern 111 may be disposed adjacent to the transparent substrate 400 at the edge of the image sensor chip 100. In a plan view, the light blocking pattern 111 may be disposed to surround the micro lens array MLA along the edge of the semiconductor chip structure SC. The light blocking pattern 111 may be disposed on the first passivation film 109. The light blocking pattern 111 may be at the same vertical level as the color filter array CFA. For example, a bottom surface of the color filter array CFA may be coplanar with a bottom surface of the light blocking pattern 111. In certain embodiments, a top surface of the color filter array CFA may be coplanar with a top surface of the light blocking pattern 111. In some embodiments, the light blocking pattern 111 may include the same material as the color filters constituting the color filter array CFA. The light blocking pattern 111 may include or be formed of a photosensitive material including a black pigment. The light blocking pattern 111 may be formed by a photolithography process. The light blocking pattern 111 blocks light incident on the color filter array CFA through the side surface of the image sensor chip 100 to prevent image quality from being distorted at the edge of the image, thereby realizing clear image quality. Other structures of the present embodiment may be the same as or similar to those described with reference to FIGS. 1A, 1B, and 2.

Figure 6:
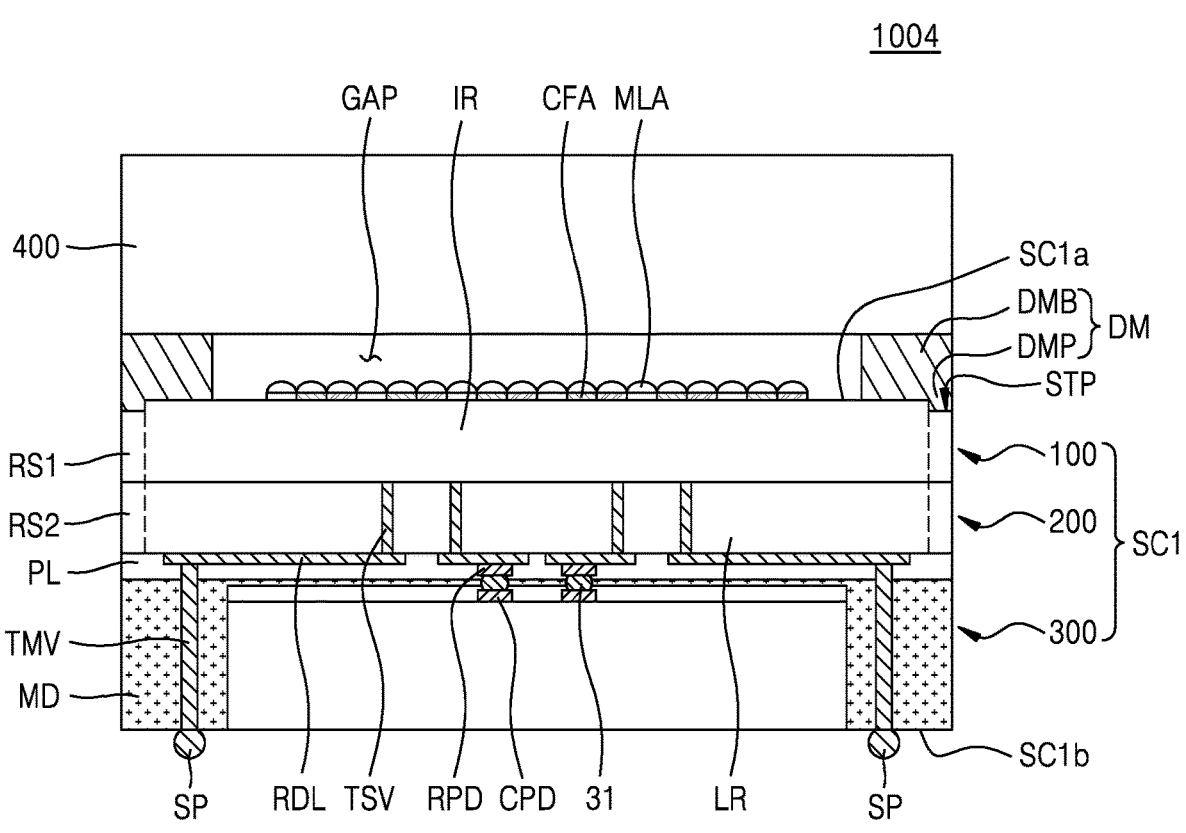
FIG. 6 is a cross-sectional view of an image sensor package according to an embodiment of the inventive concept.

FIG. 6 is a cross-sectional view of an image sensor package according to an embodiment of the inventive concept.

Referring to FIG. 6, an image sensor package 1004 may include a semiconductor chip structure SC1 and a transparent substrate 400 disposed on the semiconductor chip structure SC1. The semiconductor chip structure SC1 may have a first surface SC1a and a second surface SC1b opposite to each other. The transparent substrate 400 may be disposed on the first surface SC1a of the semiconductor chip structure SC1.

The semiconductor chip structure SC1 may include an image sensor chip 100, a logic chip 200, and a memory chip 300. The logic chip 200 may be arranged between the image sensor chip 100 and the memory chip 300. The memory chip 300 may be electrically connected to the redistribution pattern RDL of the logic chip 200 through a plurality of internal connection terminals 31. The plurality of internal connection terminals 31 may be attached to (e.g., contact) the plurality of redistribution pads RPD.

A side surface of the memory chip 300 may be covered with a mold film MD. For example, the mold film MD may surround the memory chip 300 and contacts side surfaces of the memory chip 300. The mold film MD may include or be formed of an epoxy mold compound (EMC). The mold film MD may be in contact with the redistribution insulating film PL. The side surface of the mold film MD may be aligned (e.g., coplanar) in a vertical direction with the side surface of the image sensor chip 100, the side surface of the logic chip 200, the side surface of the transparent substrate 400, and the outer surface of the dam DM. A portion of the mold film MD may be arranged between the memory chip 300 and the logic chip 200. The lower surface of the mold film MD may be coplanar with the lower surface of the memory chip 300. The through mold via TMV may penetrate the mold film MD and the redistribution insulating film PL, e.g., in a vertical direction, to contact the redistribution pattern RDL. An external connection terminal SP may be attached under (e.g., contact) the through-mold via TMV.

Although not shown in the drawing, additional redistribution patterns may be formed on the lower surface of the mold film MD and the memory chip 300, and external connection terminals SP may be attached to the additional redistribution patterns. In this example, the second surface SC1b of the semiconductor chip structure SC1 may correspond to the lower surface of the mold film MD or the lower surface of the memory chip 300.

The memory chip 300 may be, for example, a dynamic random access memory (DRAM) chip. The memory chip 300 may store data generated by the image sensor chip 100 and the logic chip 200, or may store data to be transmitted to the image sensor chip 100 and the logic chip 200.

In the image sensor package 1004 according to the inventive concept, since the memory chip 300 is electrically connected to the logic chip 200 through a redistribution pattern RDL and a plurality of internal connection terminals 31, compared to the case where a package substrate or an interposer is arranged between them, signal transmission distance may be shortened, which may improve signal transmission speed and enables a fast reading function in addition to realizing miniaturization of the image sensor package.

When the memory chip 300 is DRAM, the positions and specifications of the input/output terminals may be standardized to mass-produce and reduce cost. In this case, the logic chip 200 and the DRAM chip 300 may have different sizes, and positions of input/output terminals may not match each other. In the inventive concept, since the logic chip 200 includes the redistribution pattern RDL, the degree of freedom in wiring for electrical connections of the logic chip 200 to the memory chip 300 may be increased.

Figure 7A:
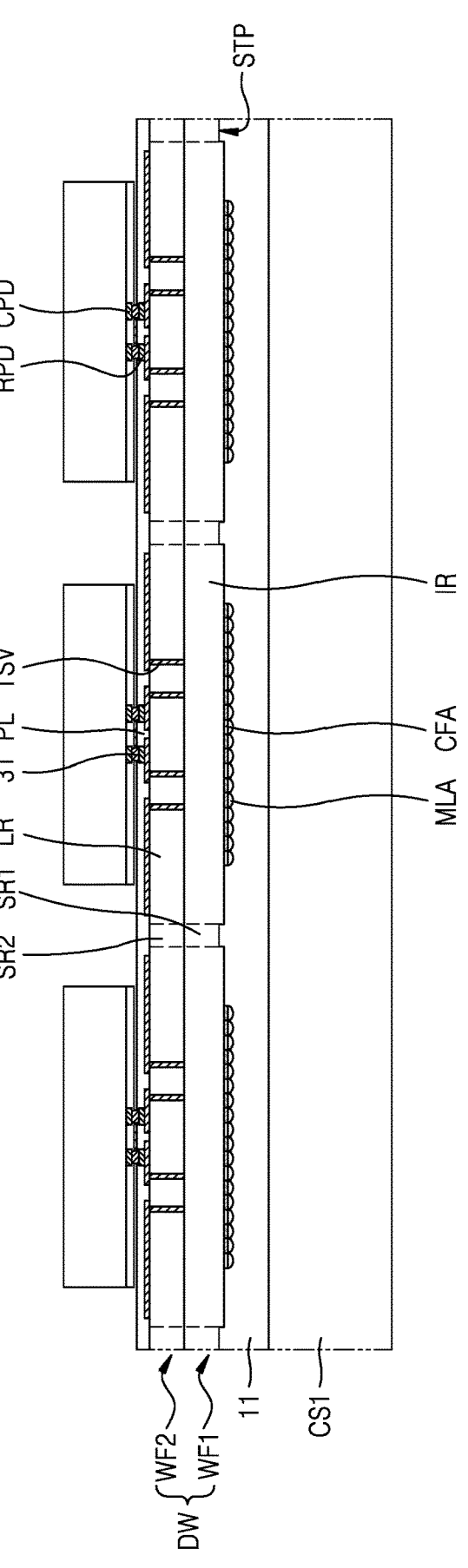
FIGS. 7A, 7B, and 7C are cross-sectional views illustrating a method of manufacturing an image sensor package, according to an embodiment.
Figure 7B:
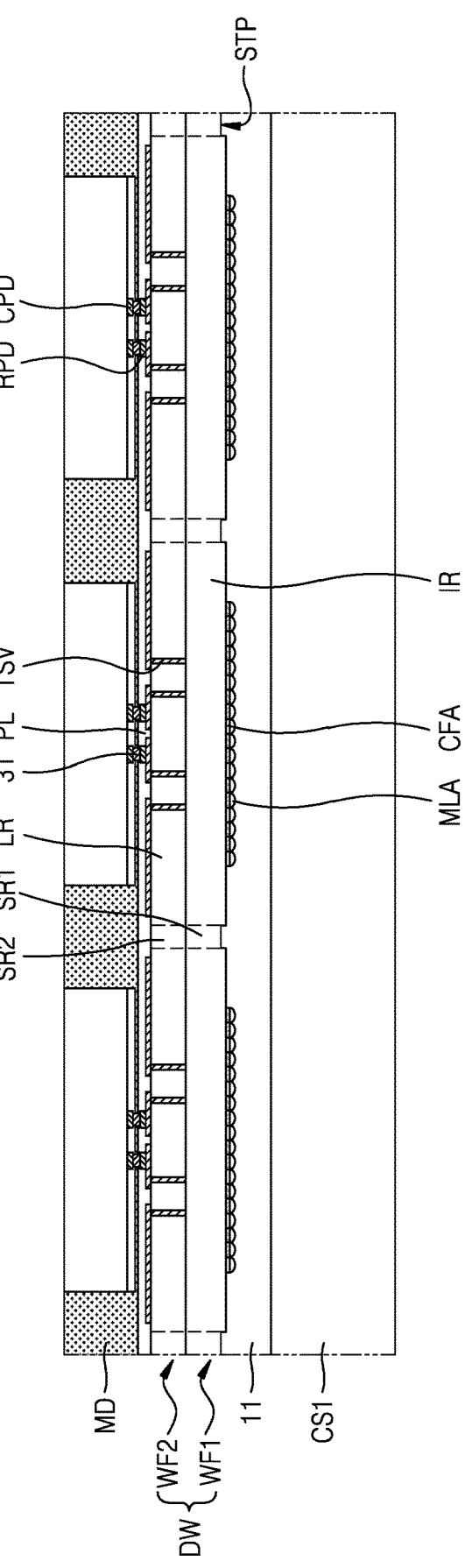
Figure 7C:
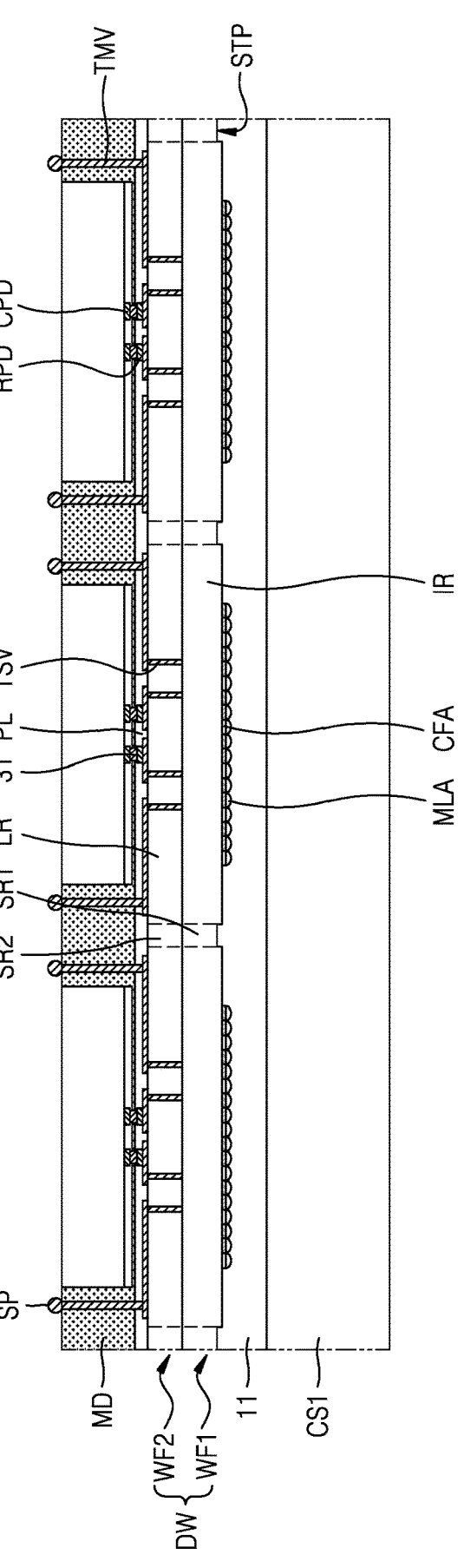

FIGS. 7A to 7C are cross-sectional views illustrating a method of manufacturing an image sensor package, according to an embodiment. For example, FIGS. 7A to 7C may be cross-sectional views illustrating operations after FIG. 3A. For example, FIGS. 7A to 7C may a manufacturing method of the image sensor package 1004 illustrated in FIG. 6.

Referring to FIGS. 6 and 7A, the memory chips 300 to which the plurality of internal connection terminals 31 are attached may be mounted on the second wafer W2 by a flip chip bonding method. The plurality of internal connection terminals 31 may be attached to (e.g., contact) the plurality of redistribution pads RPD respectively. The memory chips 300 may be respectively mounted on the logic chip portions LR.

Referring to FIGS. 6, 7B and 7C together, a mold film MD filling the space between the memory chips 300, e.g., in a horizontal direction, may be formed. A plurality of mold holes exposing the redistribution pattern RDL are formed by etching the mold film MD and the redistribution insulating film PL, and a plurality of through mold vias TMV may be formed by filling the plurality of mold holes with a conductive material. A plurality of external connection terminals SP may be attached on the plurality of through-mold vias TMV. Thereafter, with reference to FIGS. 3C to 3G, the image sensor package 1004 shown in FIG. 6 may be formed.

Figure 8:
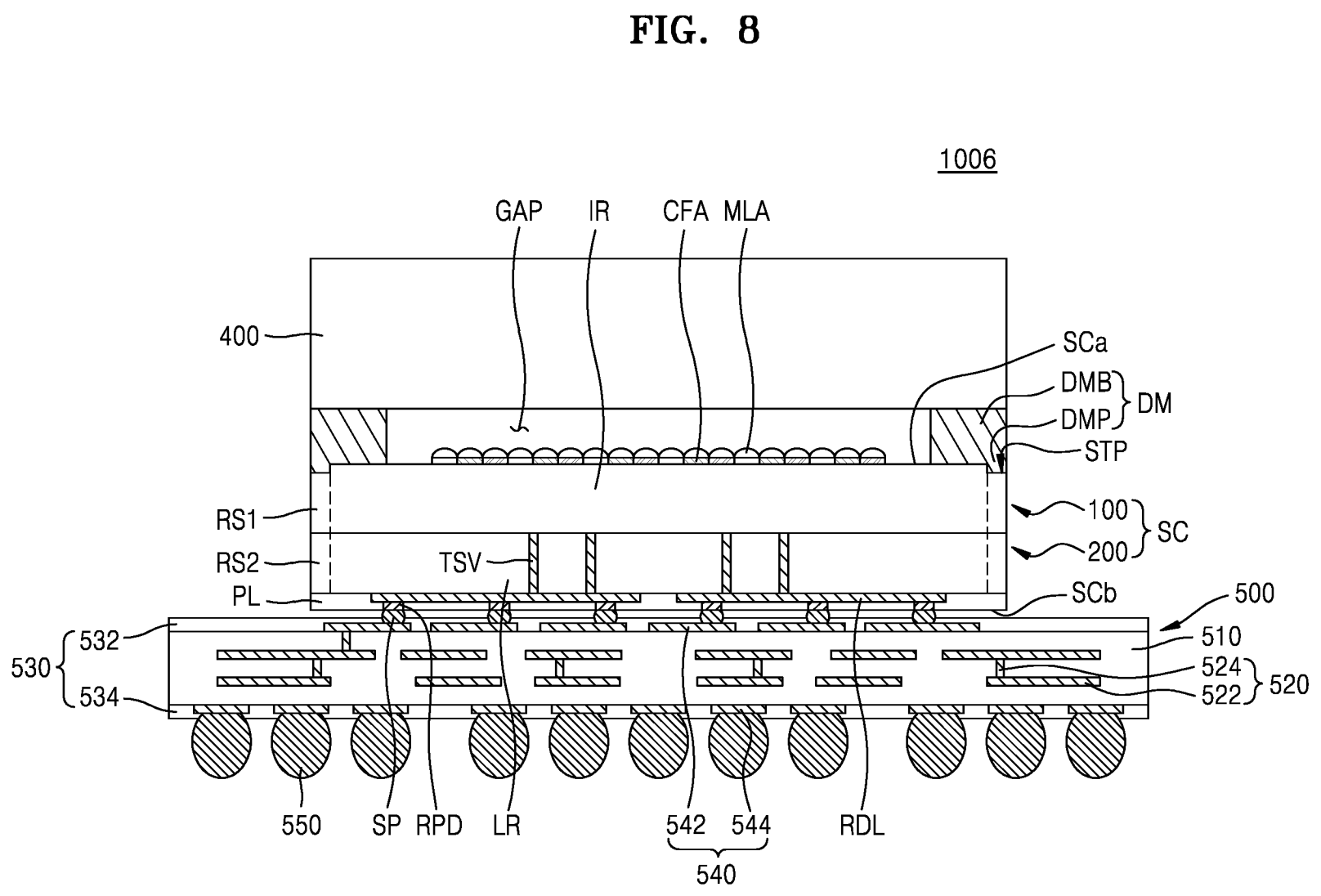

FIG. 8 is a cross-sectional view of an image sensor package according to an embodiment of the inventive concept.

Referring to FIG. 8, an image sensor package 1006 may include a package substrate 500. The image sensor package 1006 is a case in which the image sensor package 1000 shown in FIGS. 1A, 1B, and 2 is mounted on a package substrate 500 using a plurality of external connection terminals SP using a flip-chip bonding method. A plurality of system connection terminals 550 may be attached under the package substrate 500.

The package substrate 500 may be a printed circuit board. For example, the package substrate 500 may be a multi-layer printed circuit board.

The package substrate 500 may include a base board layer 510, a plurality of board wirings 520 disposed inside the base board layer 510, and a plurality of board pads 540 disposed on the upper and lower surfaces of the base board layer 510. The plurality of board pads 540 may include a plurality of board upper surface pads 542 disposed on an upper surface of the base board layer 510 and a plurality of board lower surface pads 544 disposed on a lower surface of the base board layer 510. In some embodiments, the package base board layer 510 may be made of at least one material selected from a phenol resin, an epoxy resin, and a polyimide.

A solder resist layer 530 exposing the plurality of board pads 540 may be formed on the upper and lower surfaces of the base board layer 510. The solder resist layer 530 may include an upper surface solder resist layer 532 covering the upper surface of the base board layer 510 and exposing the plurality of board upper surface pads 542 disposed on the upper surface of the base board layer 510 and a lower surface solder resist layer 534 covering the lower surface of the base board layer 510 and exposing the plurality of board lower surface pads 544 disposed on the lower surface of the base board layer 510.

The plurality of board wirings 520 may electrically connect the plurality of board upper surface pads 542 to the plurality of board lower surface pads 544, and disposed between the plurality of board upper surface pads 542 and the plurality of board lower surface pads 544 in the base board layer 510. The plurality of board wirings 520 may include a plurality of board wiring lines 522 extending in a horizontal direction and a plurality of board wiring vias 524 extending in a vertical direction inside the base board layer 510. The board wiring vias 524 may electrically connect the board wiring lines 522 located at different vertical levels to each other, the board wiring vias 524 may electrically connect the board wiring lines 522 to the board upper surface pads 542, and/or the board wiring vias 524 may electrically connect the board wiring lines 522 to the board lower surface pads 544. The board wirings 520 may be made of copper, nickel, stainless steel, or beryllium copper.

A plurality of external connection terminals SP may be attached to and/or contact the plurality of upper surface pads 542 on the base board layer 510. A plurality of system connection terminals 550 may be attached to and/or contact the plurality of board lower surface pads 544.

Figure 9:
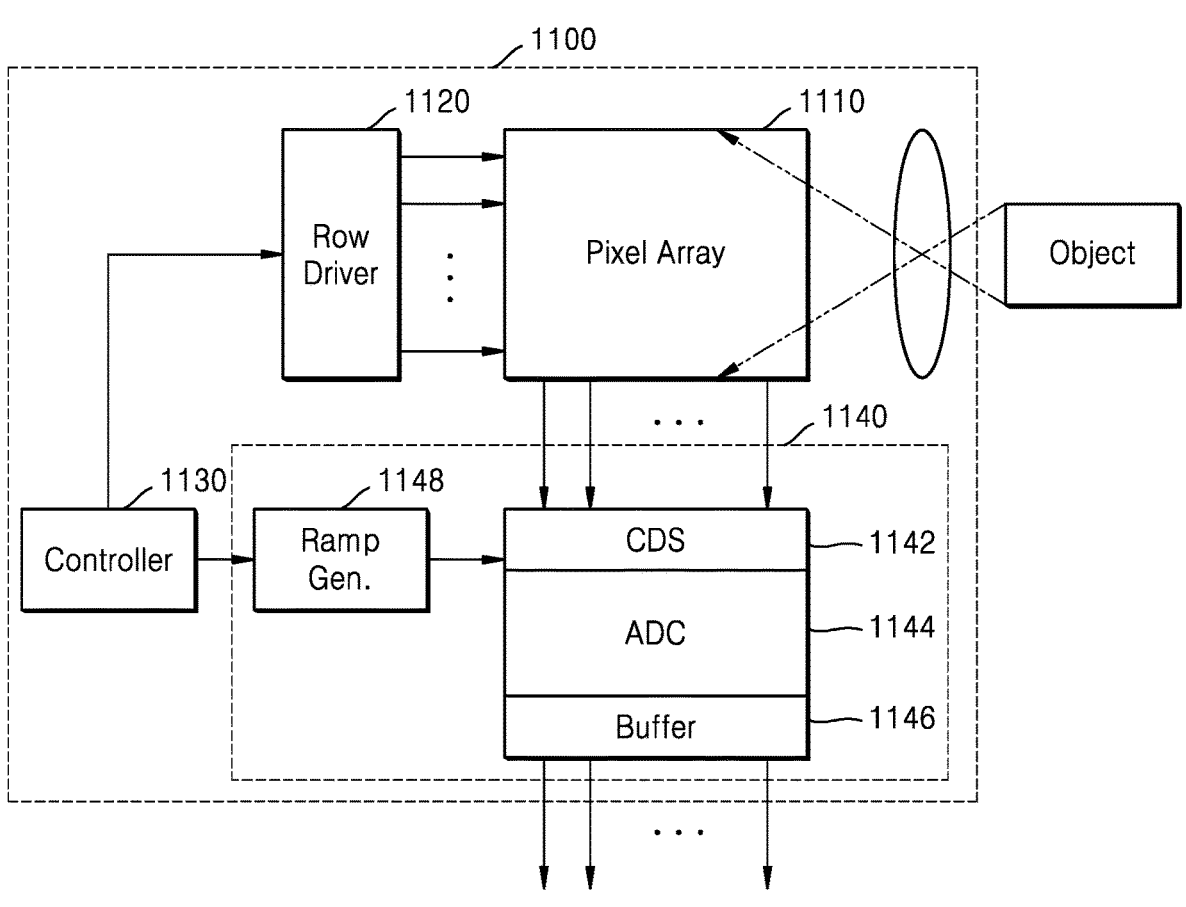
FIG. 9 is a block diagram illustrating a configuration of an image sensor package according to an embodiment of the inventive concept.

FIG. 9 is a block diagram illustrating a configuration of an image sensor package according to an embodiment of the inventive concept.

Referring to FIG. 9, the image sensor package 1100 may include a pixel array 1110, a controller 1130, a row driver 1120, and a pixel signal processing unit 1140. The image sensor package 1100 may include or may be one of the image sensor packages 1000, 1002, 1004, and 1006 described with reference to FIGS. 1A to 8.

The pixel array 1110 may include a plurality of two-dimensionally arranged unit pixels, and each unit pixel may include an organic photoelectric conversion element. The photoelectric conversion element absorbs light to generate electric charge, and an electric signal (output voltage) according to the generated electric charge may be provided to the pixel signal processing unit 1140 through a vertical signal line. The unit pixels included in the pixel array 1110 may provide one output voltage at a time in a row unit, and accordingly, unit pixels belonging to one row of the pixel array 1110 may be simultaneously activated by a selection signal output from the row driver 1120. Each of the unit pixels belonging to the selected row may provide an output voltage according to the absorbed light to an output line of a corresponding column. For example, each unit pixel of the pixel array 1110 provides one output voltage/signal based on the absorbed light energy to its photoelectric conversion element during one reading cycle, and the output voltage/ signal is transferred to the pixel signal processing unit 1140.

The controller 1130 may control the row driver 1120 such that the pixel array 1110 absorbs light and accumulates charges, or temporarily stores the accumulated charges, and an electrical signal according to the stored charge is output to the outside of the pixel array 1110 (e.g., to the pixel signal processing unit 1140). Also, the controller 1130 may control the pixel signal processing unit 1140 to measure an output voltage provided by the pixel array 1110.

The pixel signal processing unit 1140 may include a correlated double sampler (CDS) 1142, an analog-to-digital converter (ADC) 1144, and a buffer 1146. The CDS 1142 may sample and hold the output voltage provided by the pixel array 1110. The CDS 1142 may double-sample a certain noise level and a level according to the generated output voltage, and output a level corresponding to the difference. Also, the CDS 1142 may receive the ramp signal generated by the ramp signal generator 1148, compare the ramp signals with each other, and output a comparison result.

The ADC 1144 may convert an analog signal corresponding to a level received from the CDS 1142 into a digital signal. The buffer 1146 may latch a digital signal, and the latched signal may be sequentially output to the outside of the image sensor package 1100 and transmitted to an image processor (not shown).

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally unless the context indicates otherwise.

While the inventive concept has been particularly shown and described with reference to embodiments thereof, it will be understood that various changes in form and details may be made therein without departing from the spirit and scope of the following claims.

What is claimed is:

1. A method of manufacturing an image sensor package, the method comprising:

preparing a device wafer including a plurality of chip portions and a scribe lane portion surrounding the plurality of chip portions;

forming a redistribution pattern on a lower surface of the device wafer and a redistribution insulating film to cover a portion of the redistribution pattern and to cover a lower surface of the device wafer;

forming an external connection terminal on a redistribution pad that is a portion of the redistribution pattern that is not covered by the redistribution insulating film;

forming a preliminary dam pattern covering the scribe lane portion and a portion of an upper surface of the device wafer adjacent to the scribe lane portion;

placing a preliminary transparent substrate on an upper surface of the device wafer on which the preliminary dam pattern is formed;

performing a laser bonding process of radiating a laser beam to the preliminary dam pattern; and performing a singulation process forming individual image sensor packages each of which including a transparent substrate, a dam, and a residual scribe lane portion that is a portion of a chip portion and the scribe lane portion by cutting the preliminary transparent substrate, the preliminary dam pattern, and the scribe lane portion, wherein the preparing of the device wafer comprises disposing a color filter array in each of the plurality of chip portions, and disposing a micro lens array on the color filter array in each of the plurality of chip portions of the device wafer, and wherein the forming of the preliminary dam pattern is performed so that the preliminary dam pattern does not cover the color filter array and the micro lens array.

2. The method of claim 1, wherein the performing of the laser bonding process comprises bonding the preliminary dam pattern to the device wafer and the preliminary transparent substrate.

3. The method of claim 1, wherein the preparing of the device wafer comprises having a step portion in the scribe lane portion on the upper surface of the device wafer.

4. The method of claim 3, wherein the forming of the preliminary dam pattern comprises forming the preliminary dam pattern to fill the step portion.

5. The method of claim 4, wherein the dam comprises a base dam portion positioned at a vertical level higher than an upper surface of the chip portion and a protruding dam portion filling the step portion, and the base dam portion and the protruding dam portion are integrally formed.

6. The method of claim 5, wherein a thickness of the protruding dam portion is smaller than a thickness of the base dam portion.

7. The method of claim 1, wherein the preparing of the device wafer comprises forming a plurality of through electrodes extending into the device wafer from the lower surface of the device wafer.

8. The method of claim 7, wherein the plurality of through electrodes are formed to overlap each of the micro lens array and the color filter array in a vertical direction.

9. A method of manufacturing an image sensor package, the method comprising:

preparing a device wafer to which a first wafer including a plurality of image sensor chip portions and a first scribe lane portion surrounding the plurality of image sensor chip portions and a second wafer including a plurality of logic chip portions and a second scribe lane portion surrounding the plurality of logic chip portions are bonded;

forming a preliminary dam pattern covering the first scribe lane portion and a portion of an upper surface of the first wafer adjacent to the first scribe lane portion;

positioning a preliminary transparent substrate on the upper surface of the first wafer on which the preliminary dam pattern is formed;

adhering the preliminary dam pattern to the device wafer and the preliminary transparent substrate by performing a laser bonding process of radiating a laser beam to the preliminary dam pattern; and performing a singulation process forming individual image sensor packages each of which including a transparent substrate, a dam, and an image sensor chip portion and a logic chip portion by cutting the preliminary transparent substrate, the preliminary dam pattern, and the device wafer.

10. The method of claim 9, wherein the preparing of the device wafer comprises disposing a color filter array in each of the plurality of image sensor chip portions, and disposing a micro lens array on the color filter array in each of the plurality of image sensor chip portions of the first wafer.

11. The method of claim 10, wherein the preparing of the device wafer comprises forming a plurality of through electrodes extending from a lower surface of the second wafer into the logic chip portion and overlapping each of the micro lens array and the color filter array in a vertical direction.

12. The method of claim 9, wherein the preparing of the device wafer comprises:

attaching the first wafer including a first substrate and a first interlayer insulating film on a first carrier substrate; and bonding the second wafer including a second substrate and a second interlayer insulating film to the first wafer, and wherein the second wafer is bonded to the first wafer such that the first interlayer insulating film and the second interlayer insulating film are positioned to be in contact with each other.

13. The method of claim 12, wherein the forming of the preliminary dam pattern comprises:

separating the device wafer from the first carrier substrate;

attaching the device wafer on a second carrier substrate such that the second wafer faces the second carrier substrate;

forming a dam material layer on the first wafer; and removing a portion of the dam material layer.

14. The method of claim 9, wherein preparing the device wafer comprises having a step portion in the first scribe lane portion of the first wafer, the step portion having an upper surface at a lower vertical level than other portions of the first wafer, and wherein the forming of the preliminary dam pattern comprises forming the preliminary dam pattern to fill the step portion.

15. The method of claim 14, wherein the dam comprises a base dam portion positioned at a vertical level higher than an upper surface of the image sensor chip portion, and a protruding dam portion filling the step portion and having a thickness smaller than a thickness of the base dam portion as one body, and wherein the bonding of the second wafer to the first wafer comprises positioning the second wafer on the first wafer such that the first scribe lane portion of the first wafer and the second scribe lane portion of the second wafer vertically overlap each other.

16. A method of manufacturing an image sensor package, the method including:

preparing a device wafer by bonding a first wafer and a second wafer together, the first wafer including a plurality of image sensor chip portions on which color filter arrays and micro lens arrays are sequentially disposed, and a first scribe lane portion surrounding each of the plurality of image sensor chip portions, the second wafer including a plurality of logic chip portions including a plurality of through electrodes, respectively, and a second scribe lane portion surrounding the plurality of logic chip portions;

forming a preliminary dam pattern covering the first scribe lane portion and a portion of an upper surface of the first wafer adjacent to the first scribe lane portion, but not covering the color filter arrays and the micro lens arrays;

positioning a preliminary transparent substrate on the upper surface of the first wafer on which the preliminary dam pattern is formed;

adhering the preliminary dam pattern to the device wafer and the preliminary transparent substrate by performing a laser bonding process of radiating a laser beam to the preliminary dam pattern; and performing a singulation process forming individual image sensor packages each of which including a transparent substrate, a dam, an image sensor chip portion, and a logic chip portion by cutting the preliminary transparent substrate, the preliminary dam pattern, the first scribe lane portion, and the second scribe lane portion.

17. The method of claim 16, wherein in the preparing of the device wafer, the plurality of through electrodes are formed to extend from a lower surface of the second wafer into the second wafer, and wherein the plurality of through electrodes vertically overlap with each of the micro lens arrays and the color filter arrays.

18. The method of claim 16, wherein each of the image sensor packages comprises an image sensor chip including the image sensor chip portion and a first residual scribe lane portion formed by a portion of the first scribe lane portion and surrounding the image sensor chip portion, and a logic chip including a logic chip portion, and a second residual scribe lane portion formed by a portion of the second scribe lane portion and surrounding the logic chip portion, wherein a side surface of the transparent substrate, an outer surface of the dam, a side surface of the image sensor chip, and a side surface of the logic chip are in the same vertical plane, and wherein a width of the dam in a horizontal direction is about 300 μm to about 400 μm.

\* \* \* \* \*